(12) United States Patent
Hisamoto et al.

(10) Patent No.: US 7,443,731 B2
(45) Date of Patent: Oct. 28, 2008

(54) SEMICONDUCTOR NONVOLATILE MEMORY DEVICE

(75) Inventors: Digh Hisamoto, Kokubunji (JP); Kan Yasui, Kodaira (JP); Tetsuya Ishimaru, Kokubunji (JP); Shinichiro Kimura, Kunitachi (JP); Daisuke Okada, Kunitachi (JP)

(73) Assignee: Renesas Technology Corp., Tokyo (JP)

( * ) Notice: Subject to any disclaimer, the term of this patent is extended or adjusted under 35 U.S.C. 154(b) by 22 days.

(21) Appl. No.: 11/727,592

(22) Filed: Mar. 27, 2007

(65) Prior Publication Data
US 2007/0183206 A1 Aug. 9, 2007

Related U.S. Application Data

(63) Continuation of application No. 11/137,518, filed on May 26, 2005, now Pat. No. 7,212,444.

(51) Int. Cl.
*G11C 11/34* (2006.01)
*G11C 16/04* (2006.01)

(52) U.S. Cl. ............... 365/185.19; 365/185.05; 365/185.22; 365/185.28; 365/185.29

(58) Field of Classification Search ............ 365/185.19, 365/185.22, 185.28, 185.29, 185.3, 185.33
See application file for complete search history.

(56) References Cited

U.S. PATENT DOCUMENTS

| | | | |
|---|---|---|---|
| 5,642,312 A | 6/1997 | Harari | |
| 5,969,383 A | 10/1999 | Change et al. | |
| 6,279,070 B1 * | 8/2001 | Jeong et al. | 711/103 |
| 6,477,084 B1 | 11/2002 | Eitan | |
| 7,035,147 B2 * | 4/2006 | Yeh et al. | 365/185.29 |
| 2005/0237813 A1 * | 10/2005 | Zous et al. | 365/185.24 |
| 2005/0286299 A1 | 12/2005 | Tomita et al. | |

OTHER PUBLICATIONS

A.T. Wu et al., "A Novel High-Speed, 5-Volt Programming EPROM Structure with Source-Side Injection," 1986 IEEE, International Electronic Device Meeting, Technical Digest, pp. 584-587.
T.Y. Chan et al., "The Impact of Gate-Induced Drain Leakage Current on MOSFET Scaling", 1987 IEEE, International Electronic Device Meeting, Technical Digest, pp. 718-721.
W.J. Tsai et al., "Data Retention Behavior of a SONOS Type Two-Bit Storage Flash Memory Cell", 2001 IEEE, International Electronic Device Meeting, Technical Digest, pp. 719-722.
Sze, "Physics of Semiconductor Devices, $2^{nd}$ edition", John Wiley & Sons, 1981, pp. 496-506.
Sze, "Physics of Semiconductor Devices, $2^{nd}$ edition", John Wiley & Sons, 1981, pp. 447.
Sze, "Physics of Semiconductor Devices, $2^{nd}$ edition", John Wiley & Sons, 1981, pp. vii-1.
W. Chen et al., A novel Flash Memory Device with SPlit Gate Source Side Injection and ONO Charge Storage Stack (SPIN), 1997 Symposium on VLSI Technology, pp. 63-64.

* cited by examiner

*Primary Examiner*—Ly D Pham
(74) *Attorney, Agent, or Firm*—Miles & Stockbridge P.C.

(57) ABSTRACT

An operation scheme for operating stably a semiconductor nonvolatile memory device is provided.

When hot-hole injection is conducted in the semiconductor nonvolatile memory device of a split gate structure, the hot-hole injection is verified using a crossing point that does not change with time. Thus, an erased state can be verified without being aware of any time-varying changes.

Also, programming or programming/erasure is conducted by repeating pulse voltage or multi-step voltage application to a gate section multiple times.

12 Claims, 29 Drawing Sheets

SELECT TRANSISTOR    MEMORY TRANSISTOR

SELECT TRANSISTOR    MEMORY TRANSISTOR

|       | Vmg | Vd | Vs | Vcg | Vbb |
|-------|-----|----|----|-----|-----|
| Step1 | 6   | 0  | 5  | 0.5 | 0   |
| Step2 | 11  | 0  | 5  | 0.5 | 0   |

(UNIT V)

FIG. 17

|       | Vmg | Vd | Vs | Vcg | Vbb |
|-------|-----|----|----|-----|-----|
| Step1 | 5   | 0  | 5  | 0.5 | 0   |
| Step2 | 7   | 0  | 5  | 0.5 | 0   |
| Step3 | 9   | 0  | 5  | 0.5 | 0   |
| Step4 | 11  | 0  | 5  | 0.5 | 0   |

(UNIT V)

FIG. 18

|       | Vmg | Vd | Vs | Vcg | Vbb | PULSE WIDTH |
|-------|-----|----|----|-----|-----|-------------|
| Step1 | 6   | 0  | 5  | 0.5 | 0   | 1           |
| Step2 | 11  | 0  | 5  | 0.5 | 0   | 5           |

(UNIT V) (UNIT $\mu$sec)

FIG. 21

|       | Vmg | Vd  | Vs | Vcg | Vbb |
|-------|-----|-----|----|-----|-----|
| Step1 | 6   | @Ip | 5  | 1.5 | 0   |
| Step2 | 11  | @Ip | 5  | 1.5 | 0   |

(UNIT V)

FIG. 22

|       | Vmg | Vd  | Vs | Vcg | Vbb |
|-------|-----|-----|----|-----|-----|
| Step1 | 5   | @Ip | 5  | 1   | 0   |
| Step2 | 7   | @Ip | 5  | 1   | 0   |
| Step3 | 9   | @Ip | 5  | 1   | 0   |
| Step4 | 11  | @Ip | 5  | 1   | 0   |

(UNIT V)

FIG. 23

|       | Vmg | Vd  | Vs | Vcg | Vbb |
|-------|-----|-----|----|-----|-----|
| Step1 | 5   | @Ip | 6  | 1   | 0   |
| Step2 | 7   | @Ip | 5  | 1   | 0   |
| Step3 | 9   | @Ip | 5  | 1   | 0   |
| Step4 | 11  | @Ip | 5  | 1   | 0   |

(UNIT V)

FIG. 24

|       | Vmg | Vd   | Vs | Vcg | Vbb |
|-------|-----|------|----|-----|-----|
| Step1 | -5  | open | 5  | 0   | 0   |
| Step2 | -5  | open | 6  | 0   | 0   |

(UNIT V)

FIG. 25

|       | Vmg | Vd   | Vs | Vcg | Vbb | PULSE WIDTH |
|-------|-----|------|----|-----|-----|-------------|
| Step1 | -5  | open | 5  | 0   | 0   | 10          |
| Step2 | -5  | open | 6  | 0   | 0   | 100         |

(UNIT V)  (UNIT $\mu$sec)

FIG. 26

|       | Vmg | Vd   | Vs  | Vcg | Vbb | PULSE WIDTH |
|-------|-----|------|-----|-----|-----|-------------|
| Step1 | -5  | open | 5   | 0   | 0   | 10          |
| Step2 | -5  | open | 5   | 0   | 0   | 100         |
| Step3 | -5  | open | 5.5 | 0   | 0   | 100         |
| Step4 | -5  | open | 6   | 0   | 0   | 100         |
| Step5 | -5  | open | 6.5 | 0   | 0   | 100         |
| Step6 | -5  | open | 7   | 0   | 0   | 100         |

(UNIT V)  (UNIT $\mu$sec)

| | Vmg | Vd | Vs | Vcg | Vbb | PULSE WIDTH |
|---|---|---|---|---|---|---|
| Step1 | -5 | open | 5 | 0 | 0 | 10 |
| Step2 | -6 | open | 5 | 0 | 0 | 100 |
| Step3 | -6 | open | 5.5 | 0 | 0 | 100 |
| Step4 | -6 | open | 6 | 0 | 0 | 100 |
| Step5 | -6 | open | 6.5 | 0 | 0 | 100 |
| Step6 | -6 | open | 7 | 0 | 0 | 100 |

(UNIT V)  (UNIT $\mu$sec)

FIG. 29

| | Vmg | Vd | Vs | Vcg | Vbb | PULSE WIDTH | SELECTED BLOCK |
|---|---|---|---|---|---|---|---|
| Step1 | -5 | open | 5 | 0 | 0 | 10 | A0 |
| Step2 | -6 | open | 5 | 0 | 0 | 100 | A0 |
| Step3 | -6 | open | 5.5 | 0 | 0 | 100 | A0 |
| Step4 | -5 | open | 5 | 0 | 0 | 10 | A1 |
| Step5 | -6 | open | 5 | 0 | 0 | 100 | A1 |
| Step6 | -6 | open | 5.5 | 0 | 0 | 100 | A1 |
| Step7 | -5 | open | 5 | 0 | 0 | 10 | A2 |
| Step8 | -6 | open | 5 | 0 | 0 | 100 | A2 |
| Step9 | -6 | open | 5.5 | 0 | 0 | 100 | A2 |
| Step10 | -5 | open | 5 | 0 | 0 | 10 | A3 |
| Step11 | -6 | open | 5 | 0 | 0 | 100 | A3 |
| Step12 | -6 | open | 5.5 | 0 | 0 | 100 | A3 |
| Step13 | -5 | open | 5 | 0 | 0 | 10 | A4 |
| Step14 | -6 | open | 5 | 0 | 0 | 100 | A4 |
| Step15 | -6 | open | 5.5 | 0 | 0 | 100 | A4 |
| Step16 | -5 | open | 5 | 0 | 0 | 10 | A5 |
| Step17 | -6 | open | 5 | 0 | 0 | 100 | A5 |
| Step18 | -6 | open | 5.5 | 0 | 0 | 100 | A5 |
| Step19 | -5 | open | 5 | 0 | 0 | 10 | A6 |
| Step20 | -6 | open | 5 | 0 | 0 | 100 | A6 |
| Step21 | -6 | open | 5.5 | 0 | 0 | 100 | A6 |
| Step22 | -5 | open | 5 | 0 | 0 | 10 | A7 |
| Step23 | -6 | open | 5 | 0 | 0 | 100 | A7 |
| Step24 | -6 | open | 5.5 | 0 | 0 | 100 | A7 |
| Step25 | -6 | open | 5.5 | 0 | 0 | 100 | A0-A7 |

(UNIT V)    (UNIT μsec)

FIG. 30

| | Vmg | Vd | Vs | Vcg | Vbb | PULSE WIDTH | SELECTED BLOCK |
|---|---|---|---|---|---|---|---|
| Step1 | -5 | open | 5 | 0 | 0 | 10 | A0 |
| Step2 | -5 | open | 5 | 0 | 0 | 10 | A1 |
| Step3 | -5 | open | 5 | 0 | 0 | 10 | A2 |
| Step4 | -5 | open | 5 | 0 | 0 | 10 | A3 |
| Step5 | -5 | open | 5 | 0 | 0 | 10 | A4 |
| Step6 | -5 | open | 5 | 0 | 0 | 10 | A5 |
| Step7 | -5 | open | 5 | 0 | 0 | 10 | A6 |
| Step8 | -5 | open | 5 | 0 | 0 | 10 | A7 |
| Step9 | -5 | open | 5.5 | 0 | 0 | 100 | A0 |
| Step10 | -5 | open | 5.5 | 0 | 0 | 100 | A1 |
| Step11 | -5 | open | 5.5 | 0 | 0 | 100 | A2 |
| Step12 | -5 | open | 5.5 | 0 | 0 | 100 | A3 |
| Step13 | -5 | open | 5.5 | 0 | 0 | 100 | A4 |
| Step14 | -5 | open | 5.5 | 0 | 0 | 100 | A5 |
| Step15 | -5 | open | 5.5 | 0 | 0 | 100 | A6 |
| Step16 | -5 | open | 5.5 | 0 | 0 | 100 | A7 |
| Step17 | -5 | open | 6 | 0 | 0 | 100 | A0 |
| Step18 | -5 | open | 6 | 0 | 0 | 100 | A1 |
| Step19 | -5 | open | 6 | 0 | 0 | 100 | A2 |
| Step20 | -5 | open | 6 | 0 | 0 | 100 | A3 |
| Step21 | -5 | open | 6 | 0 | 0 | 100 | A4 |
| Step22 | -5 | open | 6 | 0 | 0 | 100 | A5 |
| Step23 | -5 | open | 6 | 0 | 0 | 100 | A6 |
| Step24 | -5 | open | 6 | 0 | 0 | 100 | A7 |
| Step25 | -6 | open | 5.5 | 0 | 0 | 100 | A0-A7 |

(UNIT V)  (UNIT $\mu$sec)

FIG. 31

|       | Vmg | Vd | Vs | Vcg | Vbb | PULSE WIDTH |
|-------|-----|----|----|-----|-----|-------------|
| Step1 | -5  | 0  | 5  | 0   | 0   | 10          |
| Step2 | -6  | 0  | 5  | 0.5 | 0   | 100         |

(UNIT V)     (UNIT $\mu$ sec)

FIG. 32

|       | Vmg | Vd  | Vs | Vcg | Vbb | PULSE WIDTH |
|-------|-----|-----|----|-----|-----|-------------|
| Step1 | -5  | 0   | 5  | 0   | 0   | 10          |
| Step2 | -6  | @Ip | 5  | 1   | 0   | 100         |

(UNIT V)     (UNIT $\mu$ sec)

FIG. 33

|       | Vmg | Vd   | Vs | Vcg | Vbb | PULSE WIDTH |
|-------|-----|------|----|-----|-----|-------------|
| Step1 | -2  | @Ip  | 3  | 0.5 | 0   | 50          |
| Step2 | -6  | open | 5  | 0   | 0   | 100         |

(UNIT V)   (UNIT $\mu$sec)

FIG. 34

|       | Vmg | Vd   | Vs | Vcg | Vbb | PULSE WIDTH |
|-------|-----|------|----|-----|-----|-------------|
| Step1 | 3   | @Ip  | 4  | 1   | 0   | 50          |
| Step2 | -2  | @Ip  | 4  | 1   | 0   | 50          |
| Step3 | -6  | open | 5  | 0   | 0   | 100         |

(UNIT V)   (UNIT $\mu$sec)

FIG. 35

|       | Vmg | Vd   | Vs  | Vcg | Vbb | PULSE WIDTH |
|-------|-----|------|-----|-----|-----|-------------|
| Step1 | -5  | open | 5   | 0   | 0   | 10          |
| Step2 | -5  | open | 5   | 0   | 0   | 100         |
| Step3 | -5  | open | 5.5 | 0   | 0   | 100         |
| Step4 | -5  | open | 6   | 0   | 0   | 100         |
| Step5 | 12  | open | 0   | 0   | 0   | 1000        |

(UNIT V)   (UNIT μsec)

FIG. 36

| | Vmg | Vd | Vs | Vcg | Vbb | PULSE WIDTH | SELECTED BLOCK |
|---|---|---|---|---|---|---|---|
| Step1 | -5 | open | 5 | 0 | 0 | 10 | A0 |
| Step2 | -5 | open | 5 | 0 | 0 | 10 | A1 |
| Step3 | -5 | open | 5 | 0 | 0 | 10 | A2 |
| Step4 | -5 | open | 5 | 0 | 0 | 10 | A3 |
| Step5 | -5 | open | 5 | 0 | 0 | 10 | A4 |
| Step6 | -5 | open | 5 | 0 | 0 | 10 | A5 |
| Step7 | -5 | open | 5 | 0 | 0 | 10 | A6 |
| Step8 | -5 | open | 5 | 0 | 0 | 10 | A7 |
| Step9 | -5 | open | 5.5 | 0 | 0 | 100 | A0 |
| Step10 | -5 | open | 5.5 | 0 | 0 | 100 | A1 |
| Step11 | -5 | open | 5.5 | 0 | 0 | 100 | A2 |
| Step12 | -5 | open | 5.5 | 0 | 0 | 100 | A3 |
| Step13 | -5 | open | 5.5 | 0 | 0 | 100 | A4 |
| Step14 | -5 | open | 5.5 | 0 | 0 | 100 | A5 |
| Step15 | -5 | open | 5.5 | 0 | 0 | 100 | A6 |
| Step16 | -5 | open | 5.5 | 0 | 0 | 100 | A7 |
| Step17 | -5 | open | 6 | 0 | 0 | 100 | A0 |
| Step18 | -5 | open | 6 | 0 | 0 | 100 | A1 |
| Step19 | -5 | open | 6 | 0 | 0 | 100 | A2 |
| Step20 | -5 | open | 6 | 0 | 0 | 100 | A3 |
| Step21 | -5 | open | 6 | 0 | 0 | 100 | A4 |
| Step22 | -5 | open | 6 | 0 | 0 | 100 | A5 |
| Step23 | -5 | open | 6 | 0 | 0 | 100 | A6 |
| Step24 | -5 | open | 6 | 0 | 0 | 100 | A7 |
| Step25 | 14 | open | 0 | 0 | 0 | 500 | A0-A7 |

(UNIT V)   (UNIT μsec)

SEMICONDUCTOR NONVOLATILE MEMORY DEVICE

CROSS-REFERENCE TO RELATED APPLICATION

This application is a continuation of Application Ser. No. 11/137,518 filed May 26, 2005 now U.S. Pat. No. 7,212,444.

CLAIM OF PRIORITY

The present application claims priority from Japanese Application JP 2005-062063, filed on Mar. 7, 2005, and Japanese Application JP 2004-157209, filed on May 27, 2004, the content of which is hereby incorporated by reference into this application.

BACKGROUND OF THE INVENTION

1. Field of the Invention

The present invention relates generally to semiconductor memory devices, and more particularly to a semiconductor memory device having the scheme that effectively operates a nonvolatile memory structure.

2. Description of the Related Art

Among the integrated semiconductor memories mounted in LSI are nonvolatile memories, which are an element that retains stored information even after power to the LSI has been turned off. In this context, nonvolatile memories are a very important element for using LSI in various applications.

Regarding semiconductor nonvolatile memory devices, so-called floating-gate memories and the memories that use insulating films are described in the publication "Physics of Semiconductor Devices, 2nd edition" written by S. Sze, published by Wiley-Interscience Pub, pp. 496-506. The following is known in the art as described therein: Compared with the floating-gate type, the type of memory having a stack of insulating films and storing electric charges in the traps at their interface or of the insulating films can be formed in a process very consistent with a CMOS LSI process, since there is no need to form an additional electroconductive layer.

The conventional type that stores charges in the insulating films, however, is difficult to realize, since this type is required to have sufficient charge-holding characteristics while at the same time injecting and releasing the charges. A memory that updates stored information by injecting charges of different polarities, instead of releasing stored charges, is proposed in contrast to the above type. The operation of this memory is described in "1997 Symposium on VLSI Technology", 1997, pp. 63-64. In this memory cell structure, a polycrystallized silicon gate for operating the memory, and a gate for selecting cells are separately formed. A similar description is also given in U.S. Pat. Nos. 5,969,383 and 6,477,084.

In this memory cell structure, two transistors based on NMOS, namely, a memory transistor and a select transistor, are placed next to each other so as to be interconnected in the so-called "series connection" arrangement. This transistorized circuit is shown as an equivalent circuit in FIG. 1C. A plan view and sectional view of a memory element associated with the circuit shown in FIG. 1C are shown in FIGS. 1A and 1B, respectively. A configurational example of forming an array using such memory cells is shown in FIG. 2. The select transistor and memory transistor gates (the select gate and the memory gate) constitute the word lines shown as SGL and MGL, respectively. Also, the diffusion layer of the select transistor is shown as a bit line (BL), and the diffusion layer of the memory transistor is shown as a source line (SL).

Typical programming/erasing operation in this memory cell structure is shown in FIGS. 3 and 4. The gate-insulating film 950 of the memory gate is formed to have a structure in which a silicon nitride film is sandwiched between silicon oxide films. This structure is so-called the MONOS structure (Metal-Oxide-Nitride-Oxide Semiconductor (Silicon)). The gate-insulating film 900 of the select gate is a silicon oxide film. The diffusion layer electrodes 200, 300 are formed with the select gate and the memory gate as the respective masks. The conceivable basic modes of operation in this memory cell structure are: (1) programming, (2) erasure, (3) hold, and (4) readout.

However, these designations of the four modes are typical ones and programming and erasure can be designated inversely. Although typical methods of operations are also described hereunder, other different methods of operations are proposed. An NMOS-type memory cell structure is described below for the sake of convenience in the description. However, a PMOS type can also be formed on the same principles of operation.

The state during (1) programming is schematically shown in FIG. 3. The diffusion layer 200 of the memory gate is given a positive potential, and the diffusion layer 300 of the select gate is given the same grounding potential as that of a substrate 100. The channel under the memory gate 550 can be turned on by applying thereto a high gate-overdriving voltage relative to the voltage of the substrate 100. More specifically, the channel can be turned on by increasing the potential of the select gate by 0.1-0.2 V above its threshold level. At this time, since the strongest electric field occurs near the boundary of the two gates, a number of hot electrons occur and are injected into the memory gate. The way a carrier is generated by impact ionization is denoted by reference numeral 800 in the figure. The non-hatched circle denotes an electron, and the hatched circle denotes a positive hole. The occurrence event of the carrier is known as source-side injection (SSI), which is described in the report of A. T. Wu et al. in "1986 IEEE, International Electronic Device Meeting, Technical Digest", 1986, pp. 584-587. Although memory cells of the floating-gate type are described in this report, the insulating-film type also employs the same injection mechanism. Hot-electron injection in this scheme features intensive injection into the select gate end of the memory gate because of an electric field being concentrated on the neighborhood of the boundary between the select gate and the memory gate. Also, while the floating-gate type has its charge-holding layer constituted by electrodes, the insulating-film type has electrons held in very narrow regions since the electrons are stored into the insulating films. The state during (2) erasure is schematically shown in FIG. 4. Applying a negative potential to the memory gate 550 and a positive potential to the diffusion layer 200 of the memory gate causes strong inversion in the region overlying the diffusion layer and the memory gate at the end of the diffusion layer. The strong inversion then causes tunneling between bands, thus generating holes. This condition is shown in FIG. 10. Such inter-band tunneling is described in, for example, the report of T. Y. Chan et al. in "1987 IEEE, International Electronic Device Meeting, Technical Digest", 1987, pp. 718-721. In this memory cell structure, generated holes are accelerated in the direction of the channel and then electrically attracted and injected into the MONOS films by the bias of the memory gate, whereby the erasing operation is conducted. The way the generated holes cause a positive-hole pair as secondary electrons is denoted by reference numeral 820. These carriers are also injected into the MONOS films. That is to say, the threshold levels of the memory gate that have been raised by the charges of the electrons can be lowered by means of the charges of the injected holes.

During (3) hold, charges are held as those of the carriers which were injected into the insulating films of MONOS. Since the quantities of the carriers migrating inside the insulating films are very small and the migration is slow, the charges can be efficiently held, even when a voltage is not applied to the electrodes.

During (4) readout, the channel under the select gate 500 can be turned on by applying a positive potential to the diffusion layer 200 of the select gate and another positive potential to the select gate. In this case, held charge information can be read out as a current by applying a suitable memory gate potential that allows the identification of the difference between the threshold levels of the memory gate that are given in programming and erasure modes (namely, an intermediate potential between the threshold levels in both modes).

SUMMARY OF THE INVENTION

The memory cell structure based on such operation is characterized in that the use of bipolar carrier charges allows the preset threshold levels of the memory transistors to be varied significantly. FIG. 5 is a representation of the memory gate voltage changes plotted on a horizontal axis, and the cell readout current changes plotted on a vertical axis. Measurements were conducted in the readout mode describe above. FIG. 5 indicates that compared with the I-V characteristics of an initial state, the threshold levels in programmed state 'H' are increased by injecting electrons, and that in erased state 'L', threshold levels are reduced by injecting positive holes. For example, a cell that uses the injection and emission of electrons to vary in threshold level does not permit the threshold level to be changed to the negative side from an initial state. For this reason, the cell needs to be operated between its programmed and initial states. However, significant changes in threshold level can be realized by using bipolar carrier charges. This makes a large readout cell current obtainable in an erased state. The resulting wide operating region is also effective for multivalued operation.

It is known that in the cell using the injection of a positive hole, the problem occurs in that when the positive hole is detached, the threshold level is changed. This event is described in, for example, the report of W. J. Tsai et al. in "2001 IEEE, International Electron Device Meeting, Technical Digest", pp. 719-722. Decreases in the positive charge of the positive hole shifts the threshold level toward a higher threshold over time after the injection of the positive hole. Since the information-retaining capability of the memory cell is determined by such a change in the threshold level, this change due to the detachment of the positive hole is a big problem. In addition, this change forms a hindering factor in the formation of the memory by the injection of the positive hole.

Accordingly, an object of the present invention is to provide an insulated-gate nonvolatile memory device capable of solving the above problems and conducting stable operation.

Changes in readout current due to detachment of a positive hole are shown in FIG. 6. The horizontal axis in this figure denotes changes in the gate voltage of the memory gate, and the vertical axis denotes changes in readout cell current. The I-V characteristics existing immediately after erasure and after the elapse of a definite time are plotted in the figure. It can be seen that as indicated by arrow 850, an increase in threshold level due to the detachment of the positive hole shifts the waveform to the right. Conversely, in a region of great memory gate voltages, it is observed that as indicated by arrow 860, the waveform is shifted to the left. This is the result of recovery of junction surface characteristics, associated with the detachment of the positive hole. Since two events coincide in this manner, electric current waveforms appear moving in opposite directions with their crossing point as a boundary. Strictly, the two waveforms do not cross at one point. Essentially, however, they can be regarded as crossing at one point because of their insignificant dependence upon elapsed time. In other words, even when the positive hole is detached, a point not moving can be regarded as present.

This condition is shown in FIG. 7. In FIG. 6, the electric current value at the crossing point is taken as $I_A$, and the electric current values above and below the crossing point, as $I_B$ and $I_C$, respectively. Time-varying changes in the respective threshold voltages defined as Vth-A, Vth-B, Vth-C by the current values at that time are shown in FIG. 7. The horizontal axis in this figure denotes the elapsed time from completion of erasure (positive-hole injection). An increase in Vth-C and a decrease in Vth-B are observed in association with the directions of arrows 850, 860, respectively. However, Vth-A maintains a constant value without a time-varying change. Stable memory hold characteristics can therefore be obtained by using such a crossing point.

In a semiconductor nonvolatile memory device that has a select gate and a memory gate for retaining charges in insulating films and employs positive-hole injection, a readout current value not varying with time is obtainable and stable memory operation can thus be achieved.

BRIEF DESCRIPTION OF THE DRAWINGS

FIG. 17 is another programming-pulse setting reference table;

FIG. 18 is yet another programming-pulse setting reference table;

FIG. 21 is still another programming-pulse setting reference table;

FIG. 22 is a further programming-pulse setting reference table;

FIG. 23 is a further programming-pulse setting reference table;

FIG. 24 is an erasing-pulse setting reference table;

FIG. 25 is another erasing-pulse setting reference table;

FIG. 26 is yet another erasing-pulse setting reference table;

FIG. 29 is a further erasing-pulse setting reference table;

FIG. 30 is a further erasing-pulse setting reference table;

FIG. 31 is a further erasing-pulse setting reference table;

FIG. 32 is a further erasing-pulse setting reference table;

FIG. 33 is a further erasing-pulse setting reference table;

FIG. 34 is a further erasing-pulse setting reference table;

FIG. 35 is a further erasing-pulse setting reference table;

FIG. 36 is a further erasing-pulse setting reference table;

DESCRIPTION OF THE PREFERRED EMBODIMENTS

Embodiments of the present invention will be described in detail hereunder using the accompanying drawings.

First Embodiment

Figure 8:
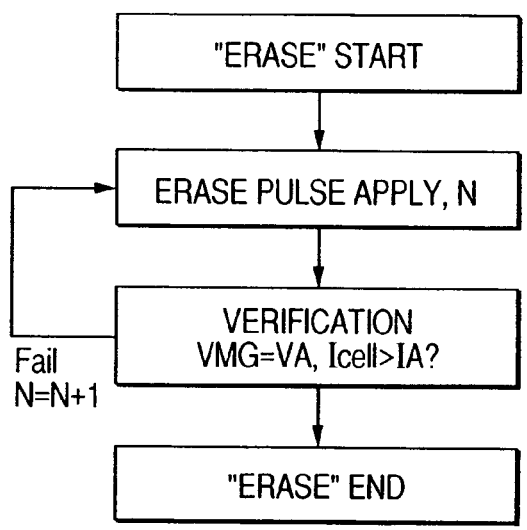
FIG. 8 is an erasing operation sequence diagram that shows erasing operation according to the present invention.

Typical erasing operation of the present invention will be described below. FIG. 8 is a flow diagram showing an erasing operation sequence of the present invention.

The so-called 'verification' is most commonly used to conduct stable programming and erasing operation in an integrated nonvolatile memory of a semiconductor-based array structure. The verification is conducted during programming and erasure so that after programming/erasing pulse application, threshold levels can be confirmed and the programming and erasing operation can be repeated for a preset potential to be reached. In order to produce a sufficiently erased state in the cells that involve positive-hole injection, the verification is also most commonly used to confirm the erased state after an erasing pulse has been applied.

Figure 6:
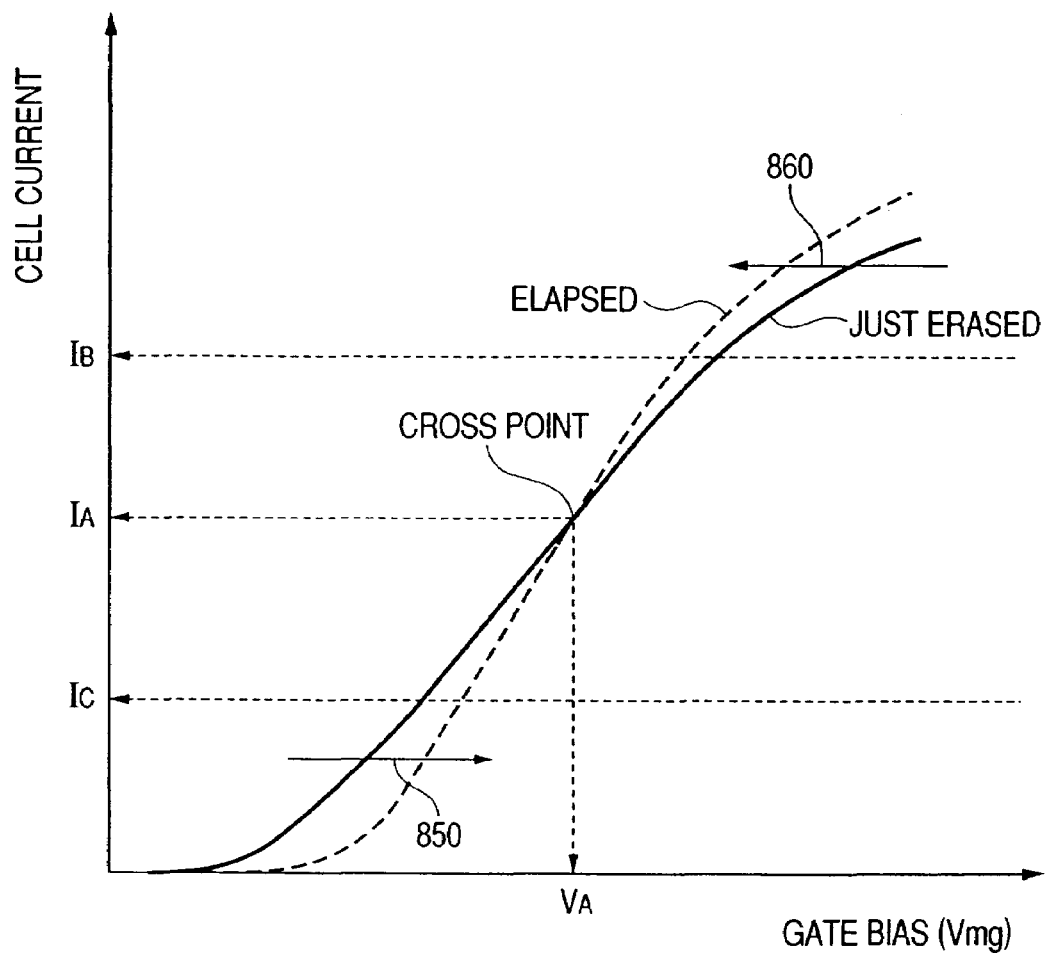
FIG. 6 is a memory transistor operational characteristics diagram showing time-varying changes in I-V characteristics under an erased state.
Figure 7:
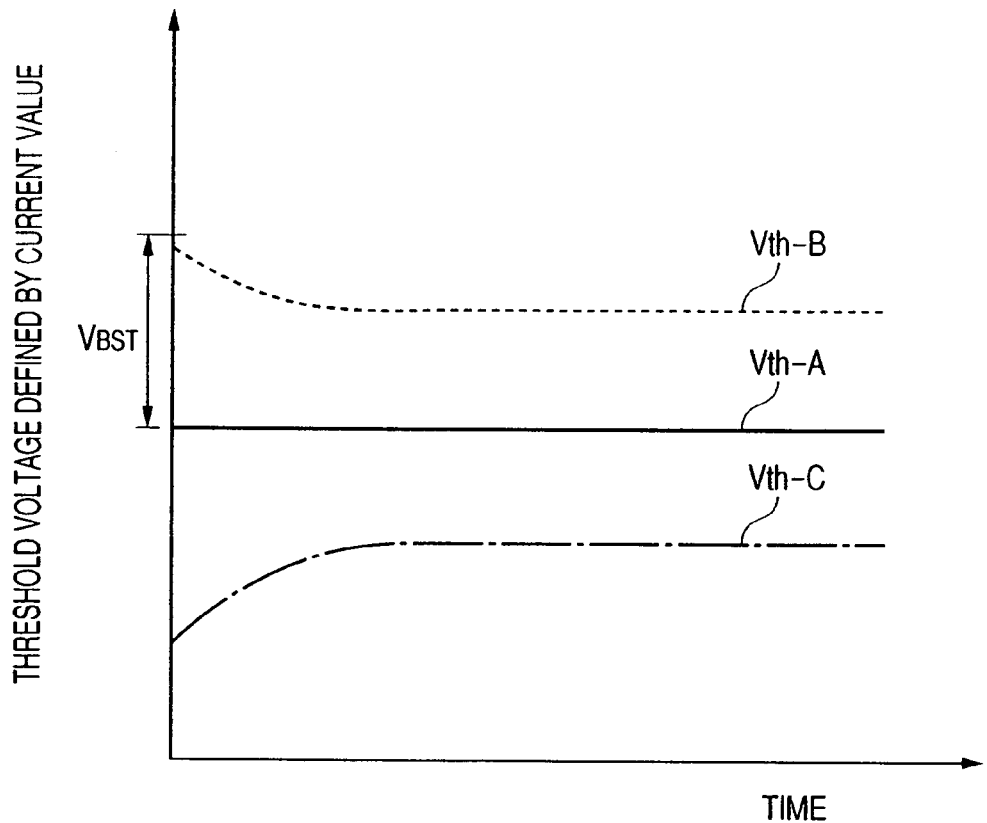
FIG. 7 is a memory transistor operational characteristics diagram showing time-varying changes in threshold level under an erased state.

Symbol VMG in FIG. 8 denotes a memory gate voltage, $V_A$ a gate voltage at a crossing point in FIG. 6, Icell a readout current flowing through a memory cell (i.e., cell current), $I_A$ the cell current at $V_A$, and N the number of erasing-pulse application operations.

Conventionally, since detachment of a positive hole changes a threshold level with time, if the verification is conducted using, for example, $I_C$ (Vth-C), the changes in threshold level with time due to the detachment will reduce an electric current value, thus making a necessary readout current unobtainable. Also, a change in the current according to a particular elapsed time up to a start of the verification will make adequate evaluation of the erased state impossible.

Accordingly, the verification is conducted by, as shown in FIG. 6, conducting a comparison with current $I_A$, at memory gate voltage $V_A$ developed at the crossing point where no changes with time are suffered. Since this electric current point suffers no changes with time after injection, the erased state can be easily identified.

Taking the readout current as the current value at this crossing point makes a stable readout current obtainable even after passage of a long time from erasure. Also, the readout current of the cell can be set from the verification voltage. For example, when $I_B$ greater than $I_A$ is required as the readout current, this can be realized by setting readout memory gate voltage $V_A$ allowing for difference $V_{BST}$ between Vth-B and Vth-A in an initial state. In voltage regions higher than $V_A$, current changes to increase. The readout current can therefore be ensured by conducting such readout potential setting. Even when such a large current is not required, the erased state can be evaluated by conducting the verification at memory gate voltage $V_A$, and subsequent changes in the current can therefore be estimated. In other words, since changes in Vth-C with time are known values, if $I_A$ that is constant can be identified, conversions can be performed considering such an effect.

A verification point can also be extrapolated. That is to say, when the verification point is set under voltage $V_F$ lower than the voltage at the crossing point, the current value at the crossing point can be estimated from the current and mutual inductance at $V_F$. Estimation results can then be used to conduct the verification at the $V_F$ point.

Second Embodiment

Next, a description is given of a method for setting conditions for the verification during programming/erasing operation when a scheme of the present invention is used. When, as described above, the verification using a crossing point is conducted in an erased state, a region between this crossing point and the verification point in a programmed state can be taken as an actual operating window of the memory cell.

Figure 9:
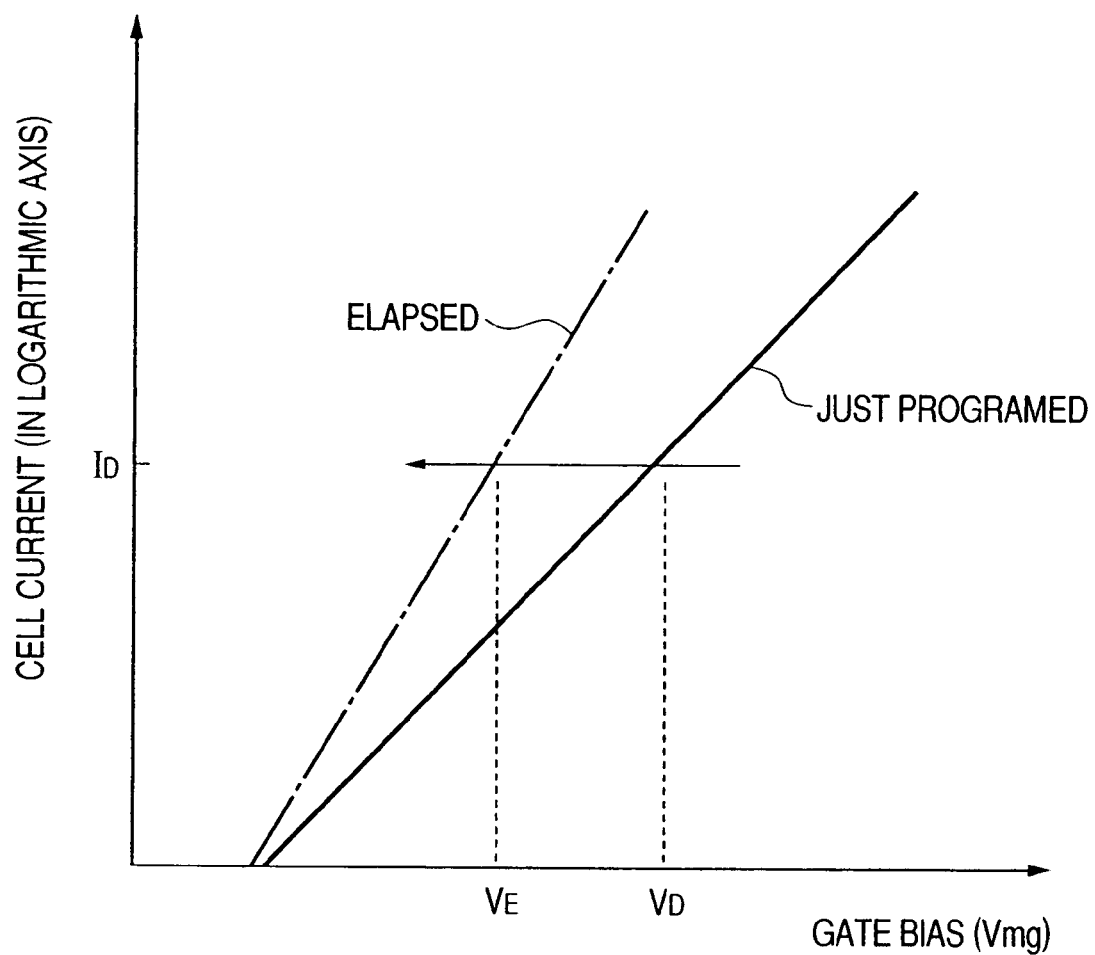
FIG. 9 is a memory transistor operational characteristics diagram showing time-varying changes in I-V characteristics under a programmed state.

It is known that in the programmed state, when a hot hole is injected into an insulating film, a surface state is generated at a junction surface of an oxide film with respect to the insulating film. When the surface state is present, a change in surface potential due to an electric field effect of the gate causes an electron to be trapped at the surface state and a charge of this electron significantly changes the threshold level defined by current. Accordingly, the change in the threshold level is added and this can be regarded as a critical problem for nonvolatile memory operation. This effect is caused primarily by electron trapping and therefore becomes a big problem on the programming side. This phenomenon is described using FIG. 9. In FIG. 9, a gate potential of the memory gate is shown on a horizontal axis, and a readout current of the cell is shown in logarithmic representation form on a vertical axis. The I-V characteristics existing immediately after programming, and those obtained after a certain time has passed are shown in the figure. Immediately after programming, a gradient of the readout current is suppressed by the surface state generated by injection of a positive hole during erasure. As time passes, however, the surface state recovers, the gradient of the readout current diminishes, and a greater inclination of an associated waveform in a vertical direction results. It is known that this recovery event appears more strongly in a high-temperature state and becomes remarkable at more than 100° C., in particular. In view of the fact that the normal approximate operating temperatures of semiconductor chips range from −40° C. to 100° C., it is not possible to avoid the above event.

For the memory cell that reads out charges as the differences in transistor characteristics, a change in the gradient of the readout current eventually appears as a change in threshold level. This means that in FIG. 9, when $I_D$ is taken a verification current value, such changes pose the problem that the verification level $V_D$ obtained immediately after programming changes to $V_E$ over time.

Figure 10:
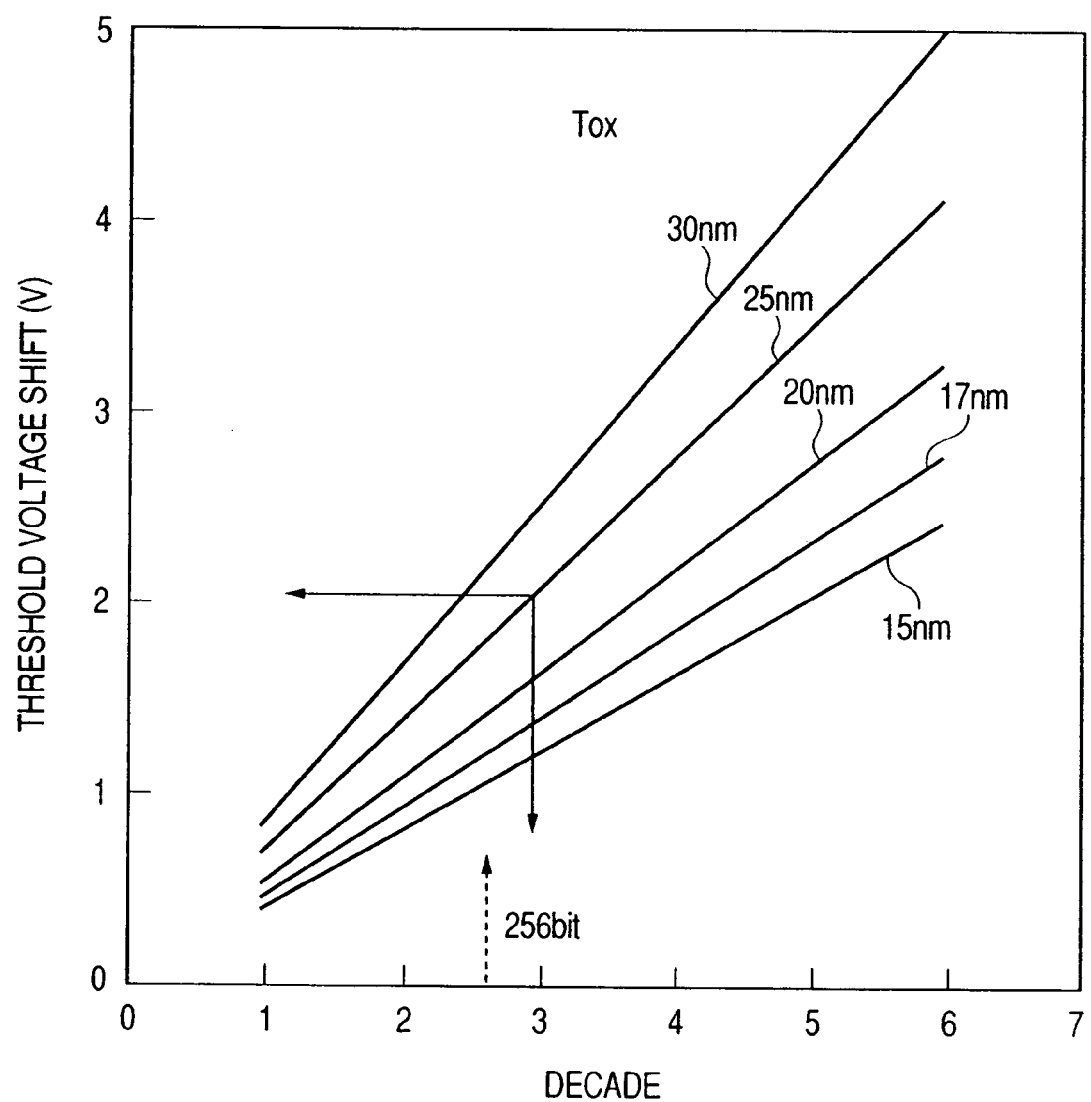
FIG. 10 is an explanatory diagram of the advantageous effects of surface states on programmed threshold levels.
Figure 11:
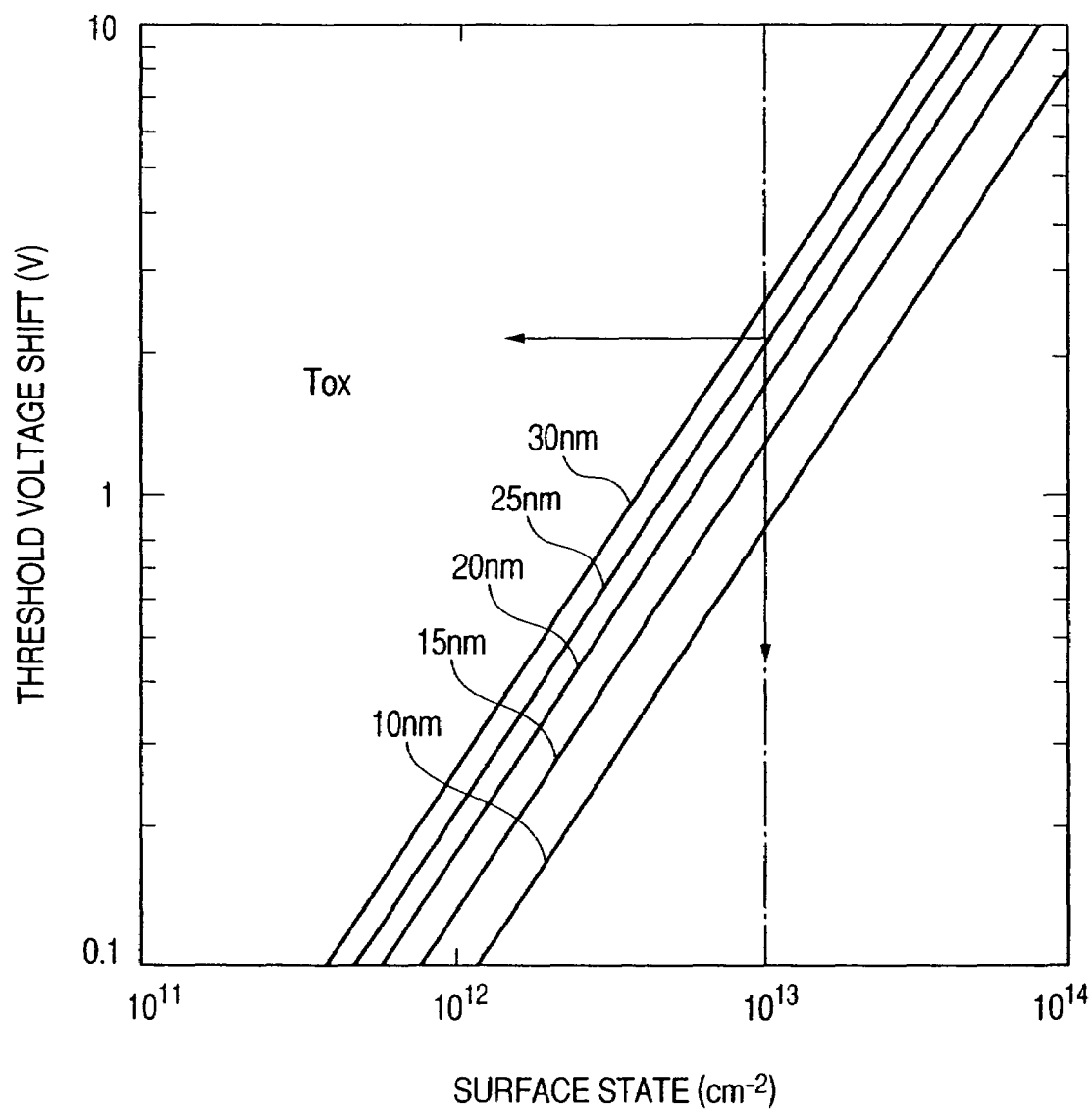
FIG. 11 is another explanatory diagram of the advantageous effects of the surface states on the programmed threshold levels.

The above changes are described below. Changes in threshold level are described in the publication "Physics of Semiconductor Devices, 2nd edition" written by S. Sze, published by Wiley-Interscience Pub, p. 447. This publication clearly describes the relationship between the quantity of surface states generated and the gradient of a memory gate voltage. FIGS. 10 and 11 are graphic representations of the relationship between a surface state quantity and verification level variations (threshold voltage shifts), derived from the description in the above publication.

In FIGS. 10, 11, a gate-insulating film thickness of the memory gate is taken as a parameter. In this memory cell structure, a gate-insulating film 950 of the memory gate uses a silicon oxide film-silicon nitride film stacked structure. In the figures, film thicknesses are shown using the effective film thickness Tox converted into an oxide film thickness. An effect of the surface state can be suppressed by reducing the film thickness of the memory gate. It is known, however, that reduction in the film thickness affects other device characteristics such as charge hold characteristics. It is also known that the reduction deteriorates programming/erasing characteristics. For these reasons, in consideration of using a select transistor and memory transistor equivalent to a submicron (less-than-1-micron) generation of transistors, Tox<25 nm is considered to be effectively usable. Also, it is probable that a manner of setting a current rate between the 'L' state and 'H' state in the memory depends strongly on sense amplifier characteristics of the array and periphery. However, in view of the fact that in a typical array structure, the number of cells that is equivalent to about 256 bits is assigned to one line, it is considered to be preferable that a rate of three digits be ensured. It follows in this case that a threshold level change of 2 V is caused by the effect of the surface state. Since it is reported that the surface state generated by the positive hole is on the order of $10^{12}$ cm$^{-2}$, $10^{13}$ cm$^{-2}$ is assumed as the maximum value usable for setting necessary conditions for a change in threshold level. FIG. 11 represents a relationship between the surface state and the change in threshold level. When $10^{13}$ cm$^{-2}$ is assumed, there is a need to allow for a change of 2 V. Thus, a readout current that is stable even after a long time has passed can be obtained by, when the verification being conducted on the programming side, adding the effect of the surface state and setting a necessary verification level to be 2 V higher than usual. Trial calculation for that purpose assumes room temperature to explain basic operation. However, it is possible to allow for temperature characteristics based on operating settings.

A method of setting as a change in threshold level, has been described above taking a practical cell current as an example. However, as shown in FIG. 9, recovery of the surface state can be observed as the gradient of the I-V characteristics curve becoming greater. For the surface state, in an electron conduction band of band gaps, positive-hole trapping becomes a central factor, and in a valence band, electron trapping works. Consequently, the recovery event can be regarded as occurring around a gate voltage at which a surface potential becomes a mid-gap. In FIG. 9, the way an associated crossing point appears on the x-axis can be seen. In this case, since the crossing point can be regarded as a steady point in the programmed state, this point can be effectively used for the verification. As a matter of fact, however, the electric current value at this crossing point is very small as shown in FIG. 9, and the use of the point is not practical. However, since the steady point appears here and the I-V waveform exhibits the so-called sub-threshold characteristics almost linear to a logarithmic axis, the crossing point can be used by being extrapolated, even if not directly.

Examples of setting are described below. In the erased state shown in FIG. 6, a cell is such that a memory gate voltage is 2 V and a cell current is 100 µA/µm. If a memory gate voltage associated with the cell current value is 4 V in an initial state, the memory gate voltage on the programming side may be set to 8 V, not 6 V, which is 2 V higher with the above-described effect of the surface state taken into consideration. Converting the effect of the gradient, however, makes it possible to lower the verification voltage on the programming side and to implement programming with a lower current value.

Using a plurality of programming pulses during the implementation of high-threshold programming makes better memory operation obtainable. As mentioned above, SSI-programmed electrons have the characteristic that they are locally injected into a narrow region. It is known that a potential barrier formed by local injection of electrons is pulled downward by permeation of an electric field in the direction of a channel and causes current leakage called "punchthrough". To realize high threshold levels, therefore, a great number of electrons need to be injected. For erasure, it is. further necessary to inject a great number of positive holes in order to erase the electrons, and the injection causes problems such as film deterioration and insufficient erasure. To avoid these problems, it is effective to combine electron programming based on a Channel Hot Electron (CHE) scheme, and the SSI scheme. The CHE scheme is used to generate hot electrons by accelerating the electrons by use of the channel and the electric field generated at an end of the diffusion layer, and inject the electrons into a charge-holding section. Accordingly, compared with SSI, the CHE scheme requires injection into a wide region spanning the neighborhood of the diffusion layer. Of course, CHE and SSI are models for explaining an electron injection mechanism, and are not strictly distinguished from each other. Herein, both are used only to explain two different kinds of pulses. Use of the pulses defined as CHE-based ones, therefore, includes SSI-like injection, and use of the pulses defined as SSI-based ones includes CHE-like injection.

Injection in a CHE-like manner is implemented by setting a low memory gate voltage compared with the voltage used for SSI. High-threshold programming is therefore accomplished by conducting CHE-based injection at a low memory gate voltage first and then raising this memory gate voltage. In this case, since CHE-based injection of electrons into a wide region is followed by SSI-based local injection, effective high-threshold programming can be accomplished with minimum quantities of electron injection. This, in turn, reduces the SSI-based injection time required, and lowers a voltage to be applied to the diffusion layer. For example, programming at a memory gate voltage of 8 V is followed by programming at a memory gate voltage of 11 V. Along with this, the diffusion layer voltage can be changed from 6.5 V to 5.5 V.

Figure 1A:
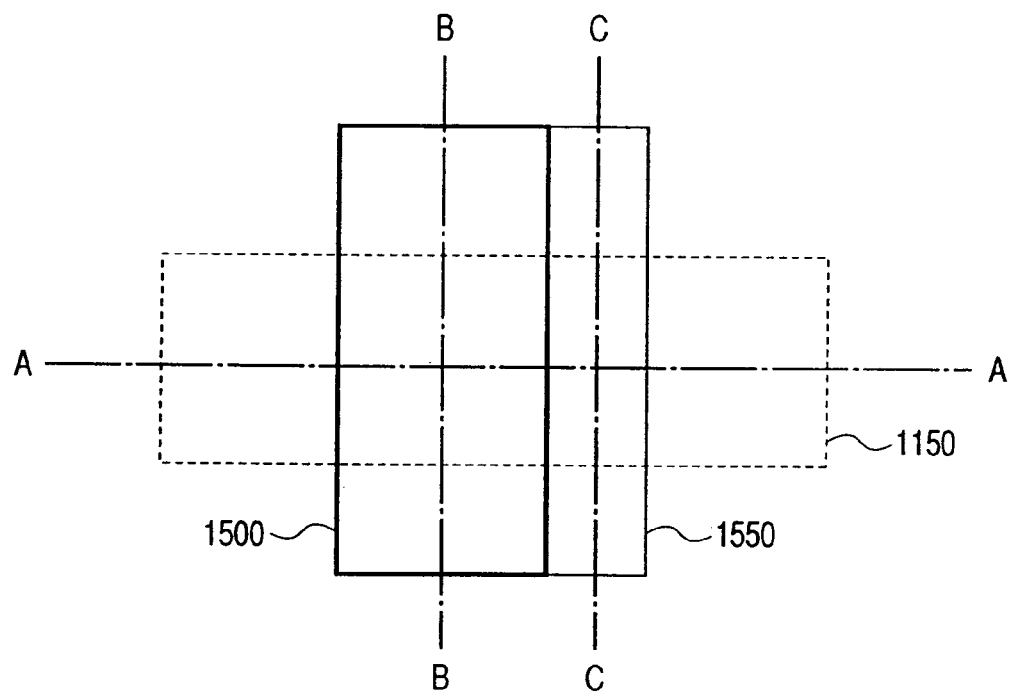
FIG. 1A is a plan view of a split-memory cell.
Figure 1B:
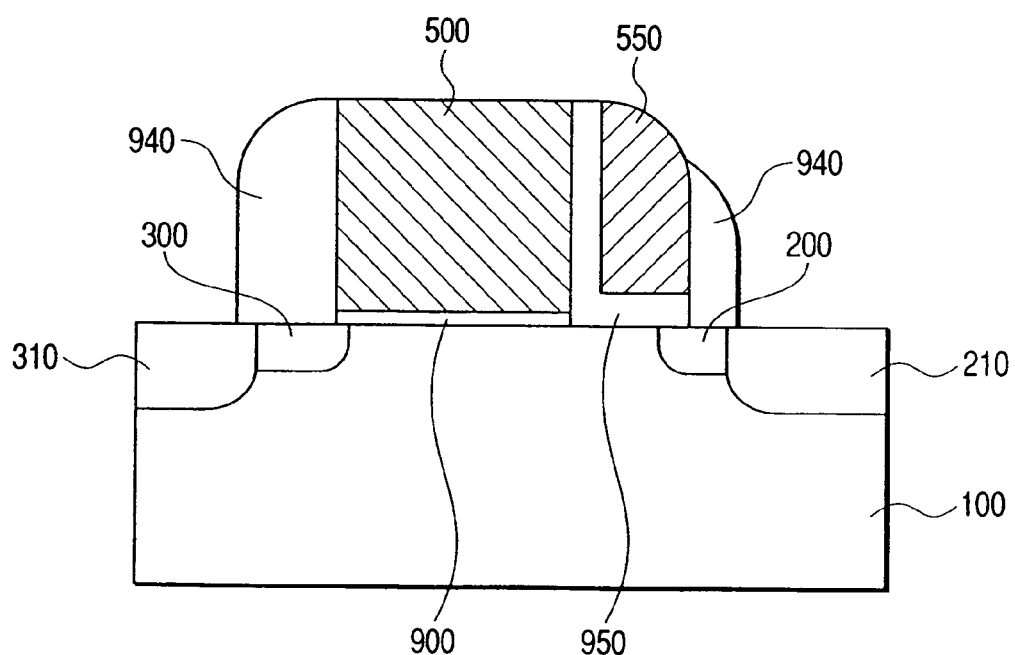
FIG. 1B is a typical equivalent circuit diagram of the split-memory cell described in FIG. 1A.
Figure 1C:
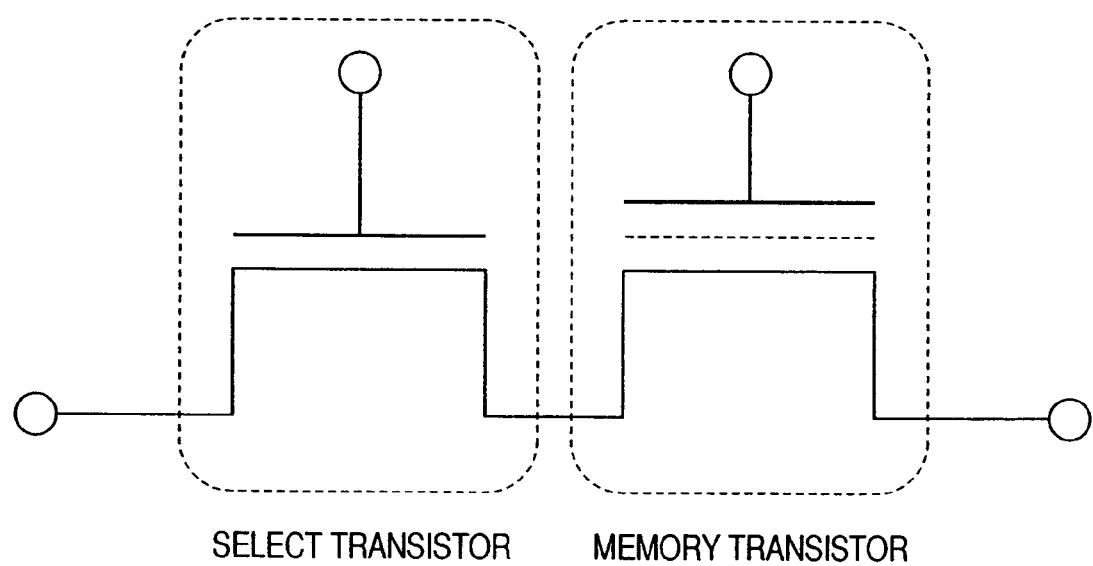
FIG. 1C is a sectional view of the split-memory cell shown in FIG. 1A.
Figure 2:
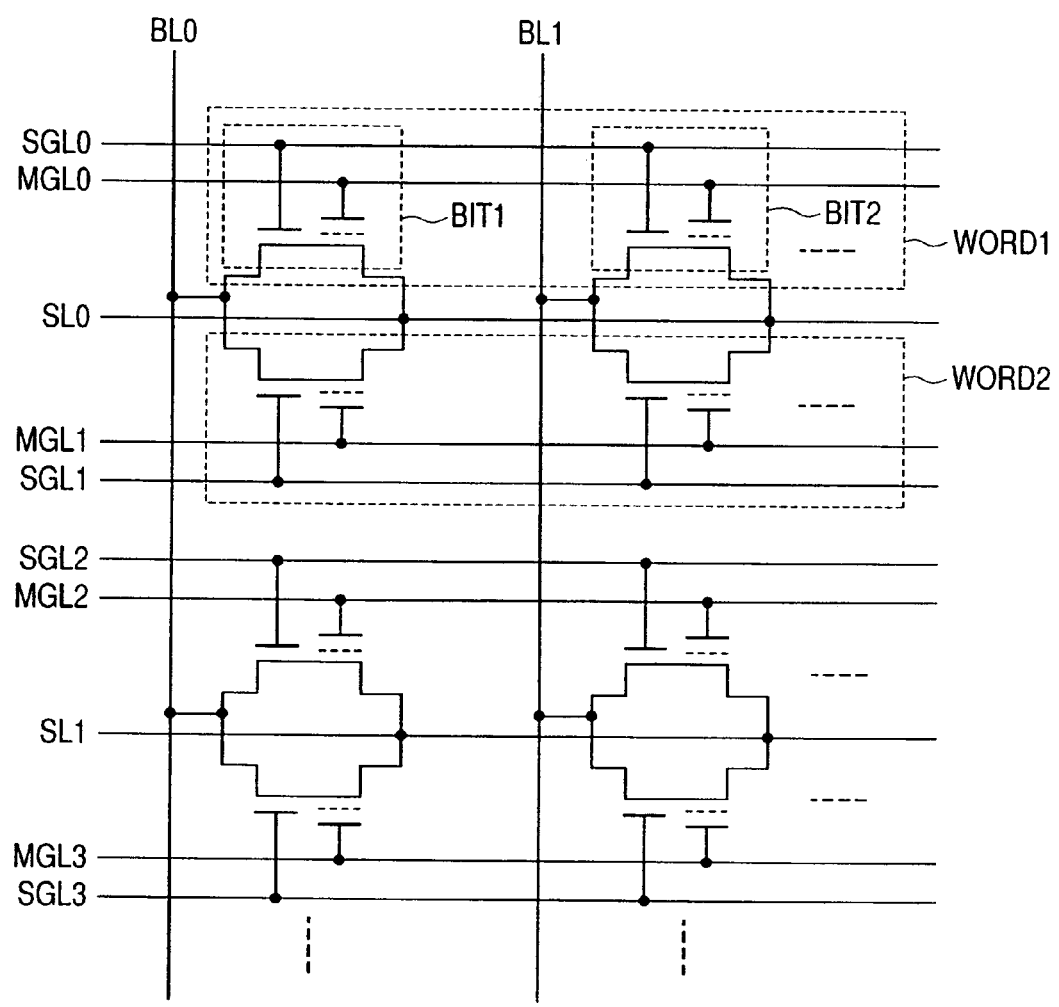
FIG. 2 is an equivalent circuit diagram of a memory array which uses split-memory cells.
Figure 3:
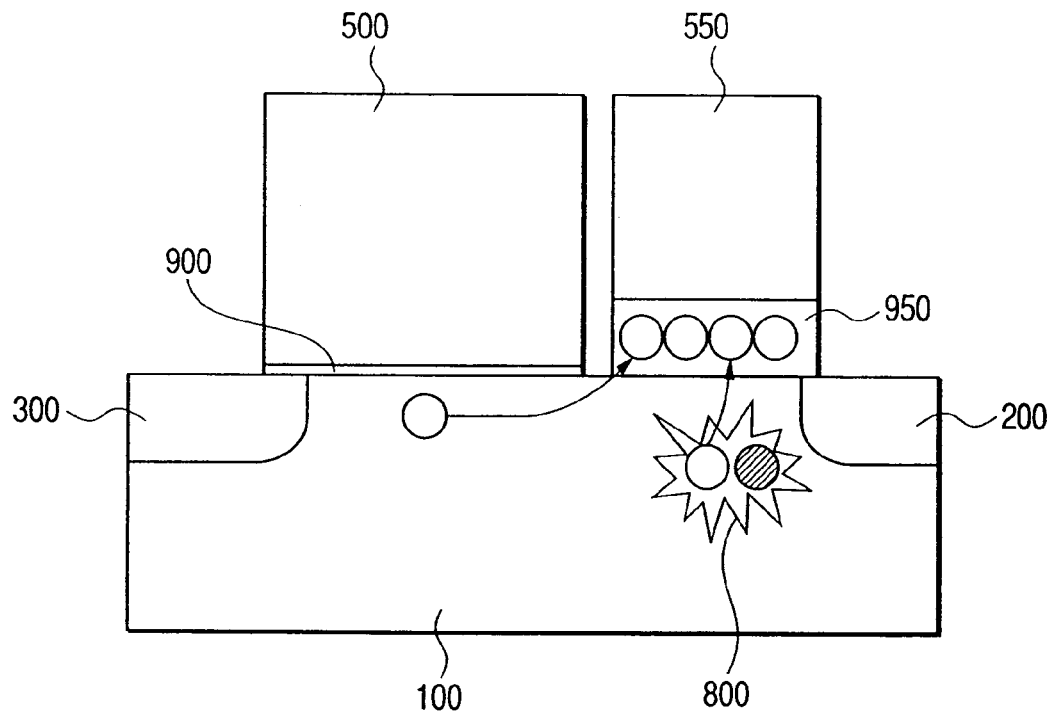
FIG. 3 is a schematic element sectional structural view for explaining a memory cell structure and programming operation.
Figure 4:
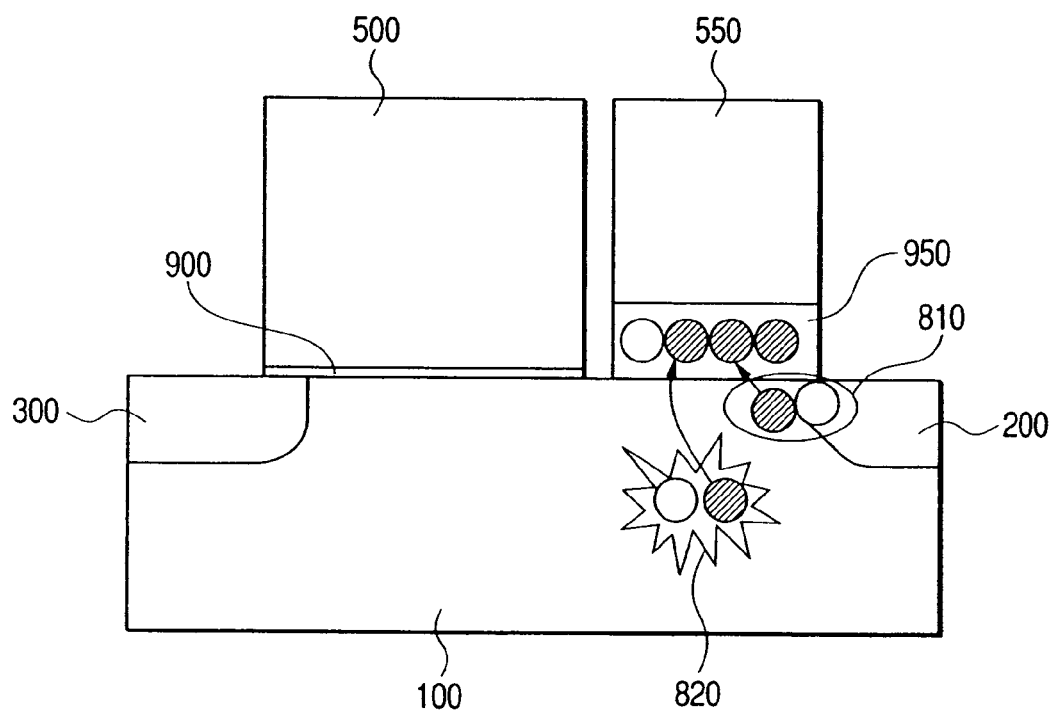
FIG. 4 is a schematic element sectional, structural view for explaining a memory cell structure and erasing operation.
Figure 5:
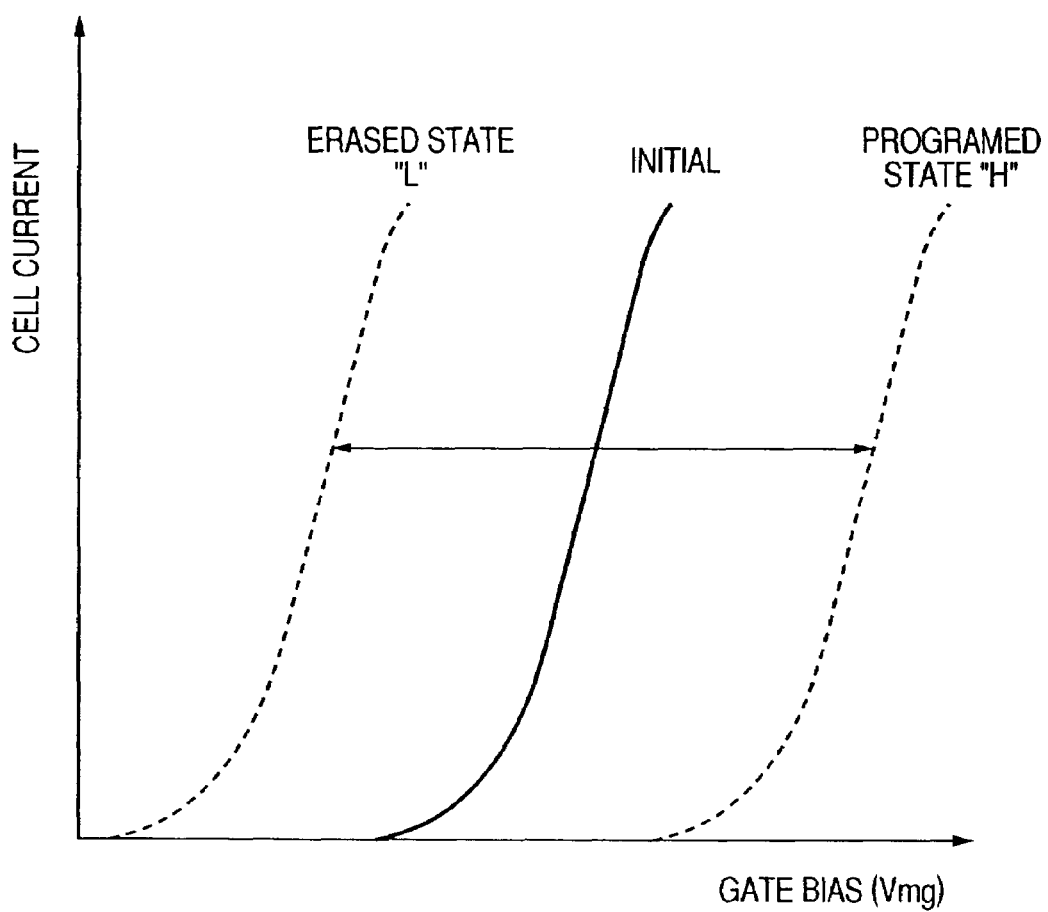
FIG. 5 is a memory transistor operational characteristics diagram for explaining programmed and erased states.
Figures 13, 14:
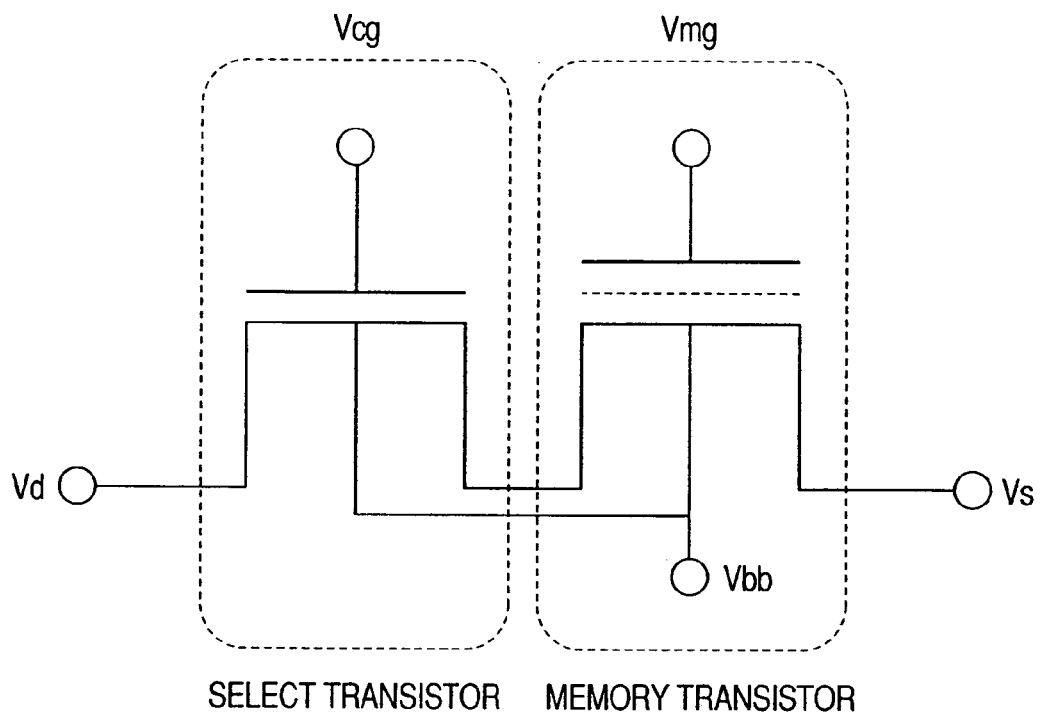
FIG. 13 is a diagram that shows the names of memory cell terminals.
FIG. 14 is a programming-pulse setting reference table.
Figure 15:
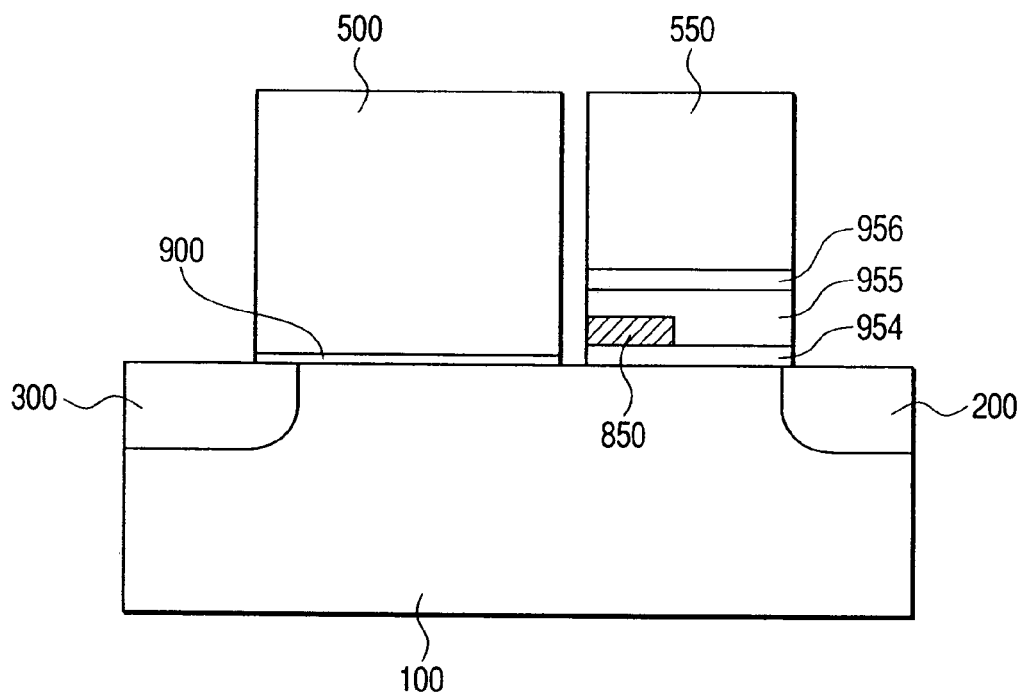
FIG. 15 is a schematic element sectional structural view that explains programming operation.
Figure 16:
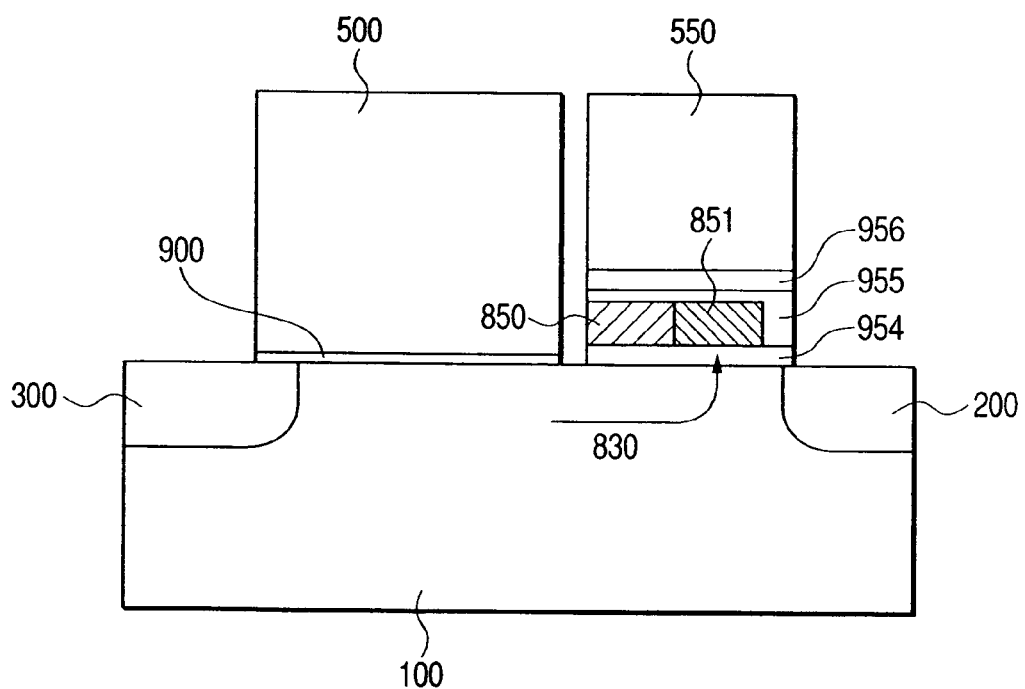
FIG. 16 is another schematic element sectional structural view that explains programming operation.

The above effects of multi-step programming are described in further detail below. During multi-step programming, when stepping-up of the memory gate voltage is relatively gentle, since injected electrons already exist, this changes subsequent electron injection distributions. It has been mentioned above that CHE injection occurs when the memory gate voltage and the diffusion layer voltage on the memory gate side are set to take a trifle large value and a trifle small value, respectively. A similar mechanism can be regarded as occurring in second and subsequent injection operations of multi-step programming, since injected electrons are already present. For clarity of description, bias names of terminals, based on FIG. 1C, are shown in FIG. 13 and the typical operating bias parameters shown in FIG. 14 are mentioned below. These parameters are shown only to give an image, and they do not specify values. A programming pulse for a memory gate voltage setting of 6 V in Step 1 is applied to inject electrons (FIG. 15). A charge storage layer having a stacked structure with a silicon oxide film 954, a silicon nitride film 955, and a silicon oxide film 956, is shown in FIG. 15. In Step 1, electrons are injected into a select transistor as denoted by reference numeral 850 first. In Step 2, even when the memory gate voltage is raised, its effective value is reduced by the electron charge stored in 850. Accordingly, as indicated by arrow 830 in FIG. 16, electrons are injected into a region 851 closer to a diffusion layer electrode 200. Of course, electron injection into 850 during the injection into 851 cannot be completely prevented and an electron density distribution of 850 and a distribution thereof in a film-thickness direction, therefore, change in a spreading manner. This is attributable to the fact that a CHE-like injection mechanism is strongly working during programming of a next stage. For this reason, even when the final memory gate voltage is high, electron injection with CHE can be conducted by performing multi-step injection. Since injected electrons can be widely distributed over the memory gate region, threshold levels can be effectively enhanced by the wide distribution. Conversely, when the threshold levels remain the same, unit charge densities of the injected electrons at each injection location can be lowered in the wide distribution and programmed-electron hold characteristics can therefore be improved.

Figure 37:
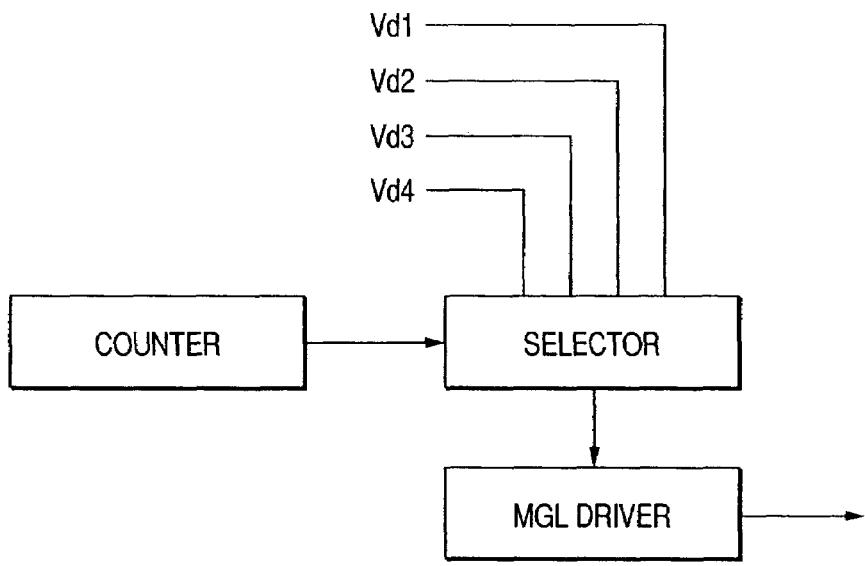
FIG. 37 is a circuit block diagram for generating pulses to be applied in association with a programming-pulse setting table.

FIG. 17 shows another example of multi-step injection in which the above-mentioned verification can be combined. More specifically, it is possible, by conducting the verification in a necessary step, to inject electrons to a necessary threshold state without having to apply an unnecessary high memory gate voltage. For example, if programming up to a sufficient height is possible in Step 3, since it is unnecessary to perform Step 4, the programming process can be conducted at memory gate voltages up to 9 V. In this programming scheme, the pulse-setting reference table shown in FIG. 17 is used and the programming operation is conducted in each step in accordance with the reference table. During electron injection in Step 1, since a voltage drop due to the electrons is small, short pulse widths can be set using the reference table shown in FIG. 18. That state is shown in FIG. 18. These reference tables can be formed as a control program for the nonvolatile memory array. Also, use of an element allows the reference tables to be incorporated into memory array circuits as part of the circuit composition. For example, voltages that vary from step to step can be applied by, as shown in FIG. 37, providing a pulse application step counter and driving a driver of the memory gate (MGL) via a selector of power supply lines (Vd1, Vd2, Vd3, Vd4) each having a different potential.

Figure 19:
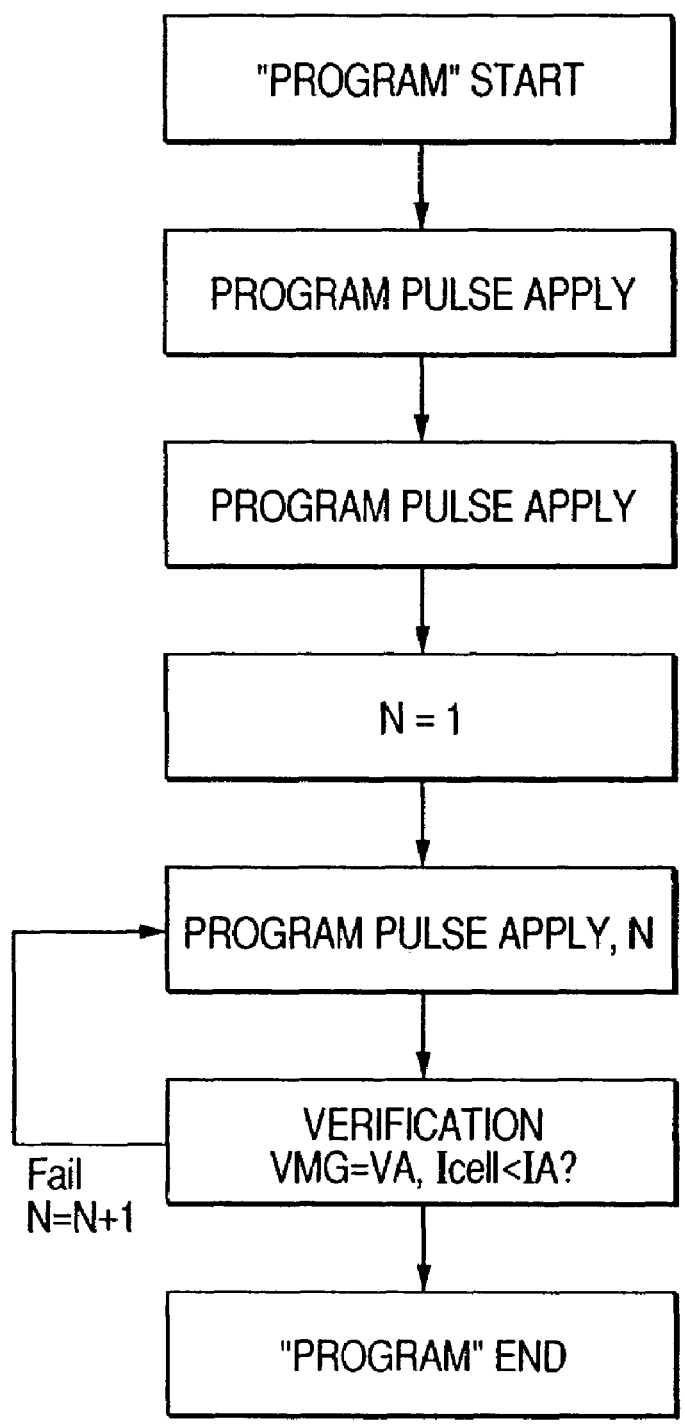
FIG. 19 is a programming-pulse and verification sequence explanatory diagram.

It is obvious that when sufficiently weak electron injection is used to perform Step 1, verification standards are not reached even by conducting the verification after performing Step 1. Accordingly, the programming time required can be shortened by skipping the verification to be conducted following completion of Step 1. Although the description has been given using Step 1, in a case of conducting multi-step programming, omitting unnecessary verification in Step 2 onward and repeating the programming operation before conducting the necessary verification is effective in shortening the programming time required. A programming sequence to be applied when skipping verification in initial two stages and conducting the verification during subsequent pulse application is shown in FIG. 19.

Figure 38:
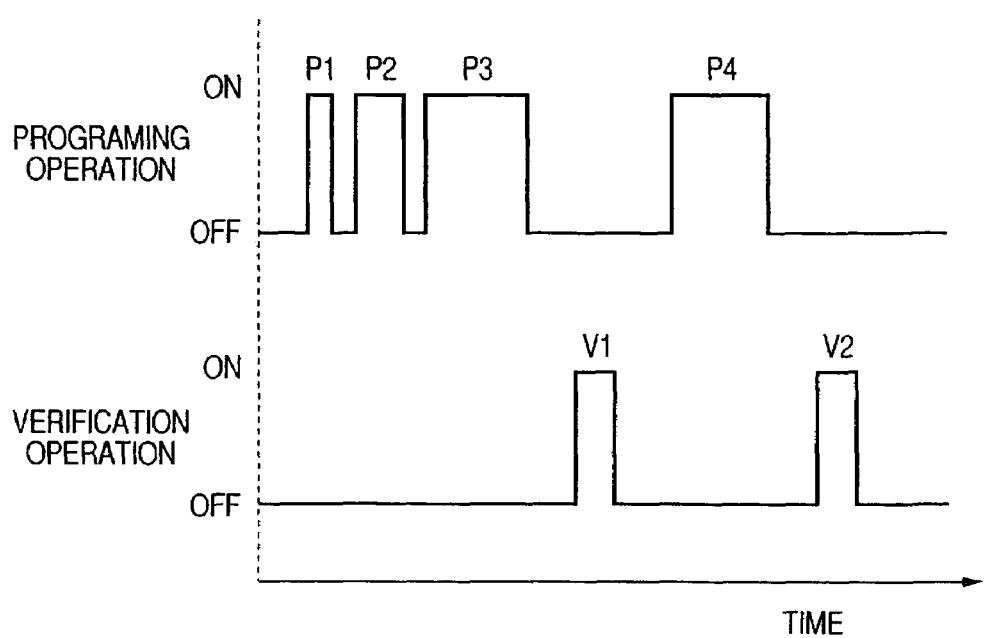
FIG. 38 is a timing chart showing the pulses applied in a programmed state in an embodiment.
Figure 39:
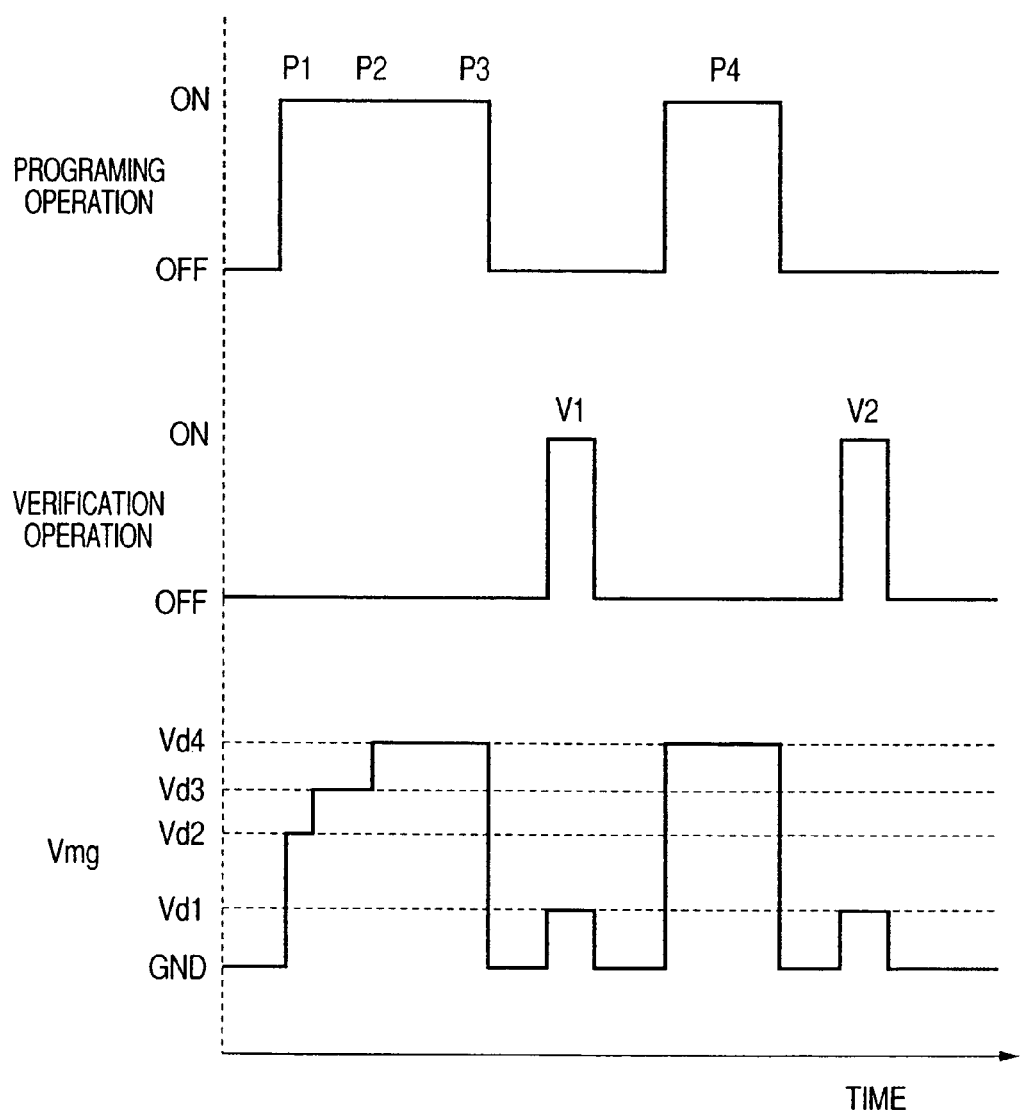
FIG. 39 is a timing chart showing the pulses applied in a programmed state in another embodiment.
Figure 40:
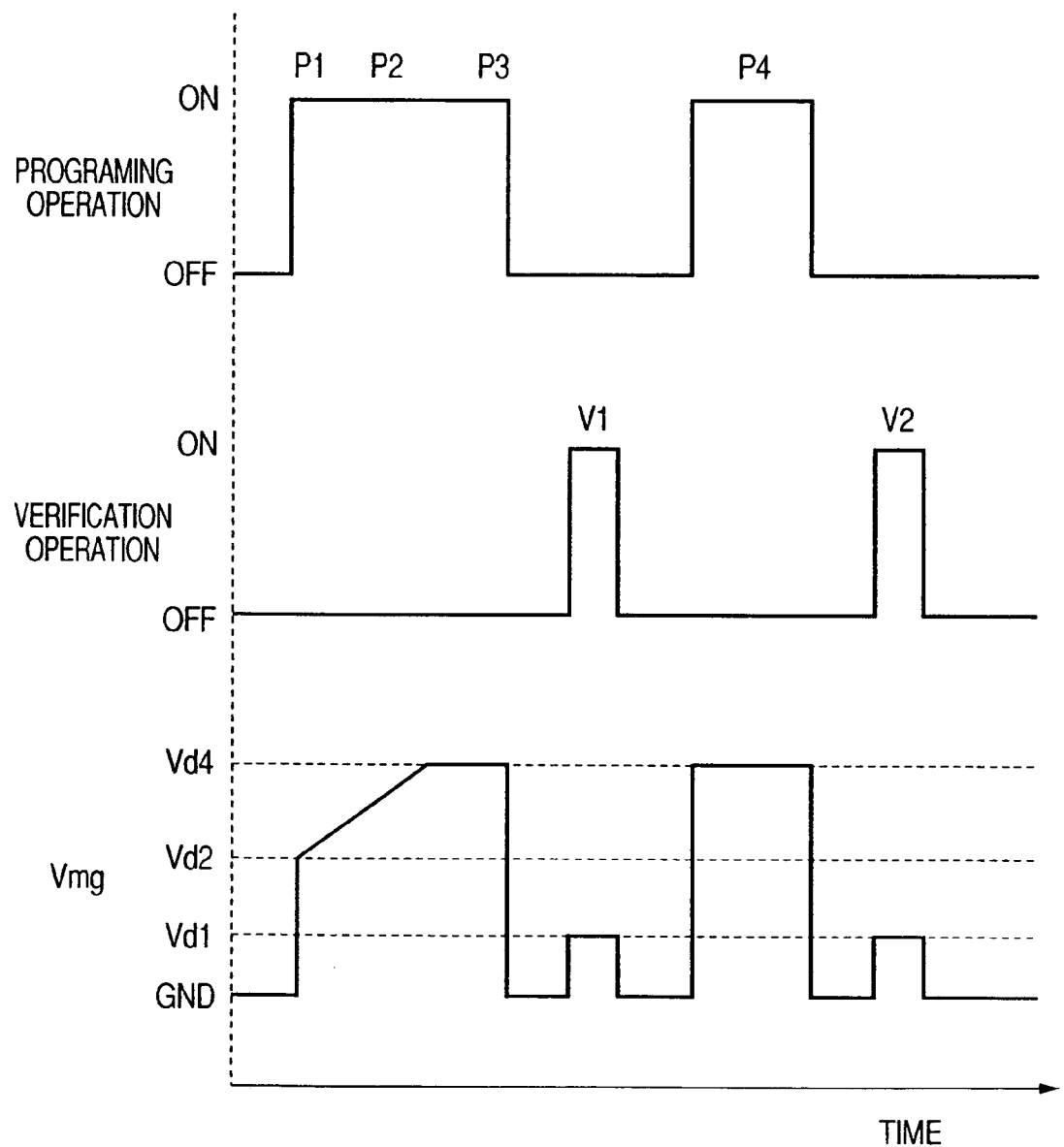
FIG. 40 is a timing chart showing the pulses applied in a programmed state in yet another embodiment.

In FIG. 38, a combination of the pulses to be applied for programming is shown using a timing chart. A description is given below with attention being focused on one cell. In FIG. 38, application of programming pulses P1, P2, P3 is followed by verification (V1), and a programming pulse P4 is additionally applied as necessary. Although the P1, P2, and P3 pulses in FIG. 38 are applied in split form, these pulses can also be integrated into a single pulse, as shown in FIG. 39. In addition to application timing, a status of the different memory gate biases applied in association with P1, P2, P3 is shown in FIG. 39. In this figure, "Vd1" is associated with a verification point. Also, similar effects can be obtained by, as shown in FIG. 40, temporarily changing the voltage in steps, even for the same pulse width.

Repetition of reprogramming deteriorates the charge-holding film and thus requires stronger programming. For these reasons, the programming time can be reduced by, before the number of reprogramming operations is increased to a certain extent, conducting a first verification in an earlier step, and when the number of reprogramming operations is increased, conducting the first verification in an even later step. While programming has been described above, this sequence is also effective for multi-step erasure.

Examples of applying all terminal voltages listed in the table have also been described heretofore.

Figure 20:
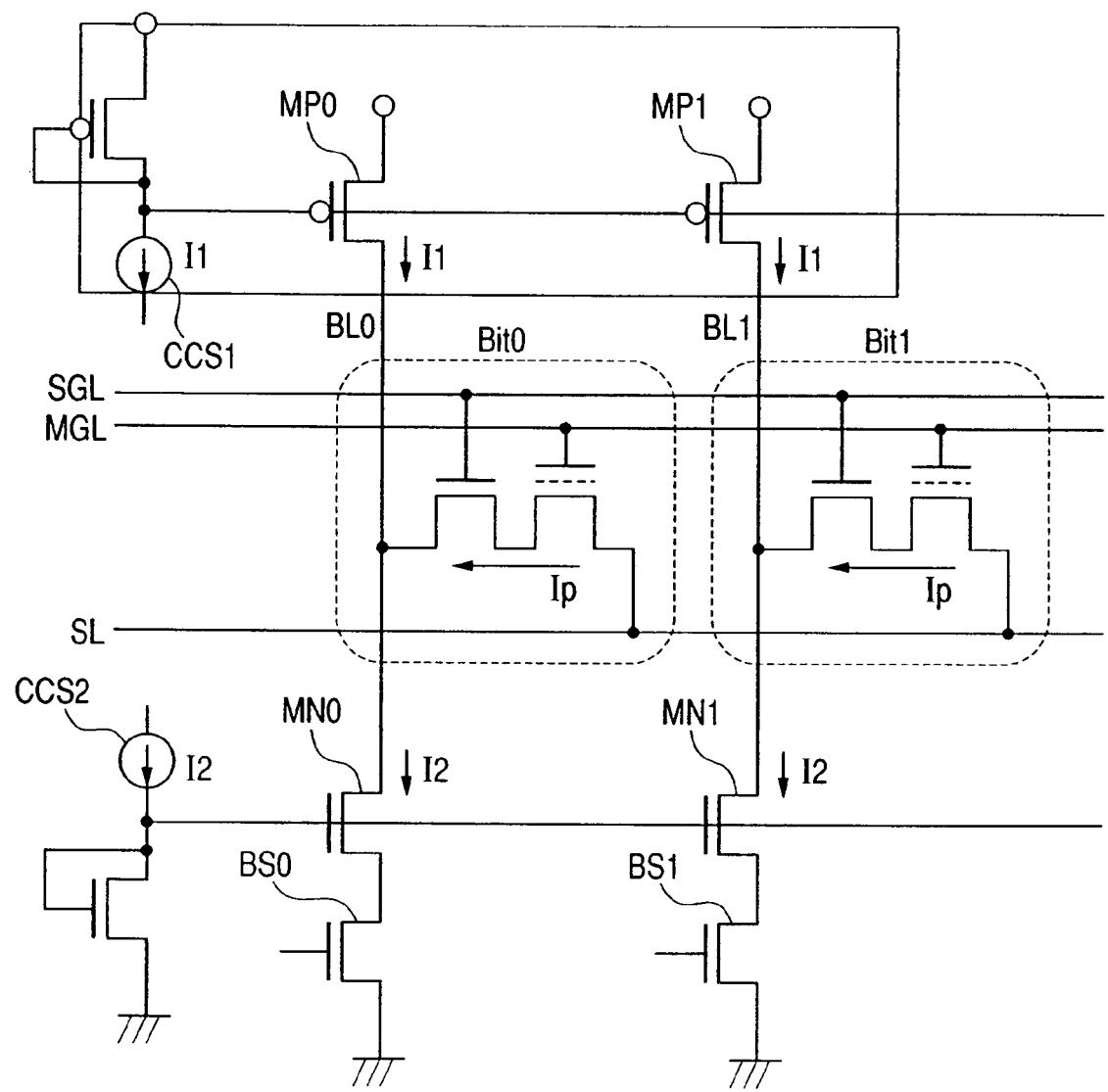
FIG. 20 is a memory cell array equivalent circuit diagram.

For such array operation and structure as shown in FIG. 20, however, the reference table can be constructed using electric current values as parameters, instead of using voltage-based parameters. By way of example, programming into two memory cells (Bit0 and Bit1) of FIG. 20 is described below. In this example, respective drain-side diffusion layer potentials (Vd) are given via bit lines BL0 and BL1 during programming. The bit lines BL0, BL1 are respectively sandwiched between MP0, MP1 at top and MN0, MP1 at bottom, with respective gate potentials being given by the circuits connected to constant-current sources CCS1 and CCS2. Since CCS1 and CCS2 supply currents I1 and I2, respectively, a potential at which the current of I1 will flow into gates of MP0, MP1 is set to be given thereto. Likewise, MN0 and MN1 are each set to a gate potential at which the current of I2 will flow. At this time, BS0 and BS1 are turned on to select a cell to be programmed in "H". Since the current I1 flows in from top and the current I2 flows out from bottom, the memory cell can take a state in which a current Ip flows. That is, "Vd" can take a potential that establishes a relationship of Ip=I1−I2. For example, if the cell current Ip is 1 μA, a gate-overdriving voltage (Vcg−Vd) of the select transistor in FIG. 14 is 0.5 V and in association with this, a potential of about 1 V is given as "Vd" in FIG. 21. In the description given here, substrate effects are omitted for a better understanding of the description. An array structure like this has the feature in which since the gate potential of the select transistor can be defined by the cell current, the gate voltage can be set more flexibly. That is to say, a memory cell with a setting of 1.5 V in FIG. 21 can also change the setting to 1 V, as shown in FIG. 22. In this case, even if "Vs" takes the same value (5 V), it is possible to reduce "Vd" and hence to increase "Vs−Vd". Programming efficiency can thus be enhanced.

Also, electrons can be injected more widely by, as shown in FIG. 23, setting high diffusion layer electrode potential "Vs" for a low memory gate potential setting.

The scheme using the pulse-setting reference table is also effective for erasure. During erasing operation, in the cell that has been programmed in the 'H' state, a strong electric field is generated by the charge of the stored electrons. This means that the erasing pulse applies a negative bias to the memory gate and a positive bias to the diffusion layer electrode potential at the memory gate side. At this time, since the charge of the electrons is present, an effective negative bias of the memory gate is strengthened and a differential potential between the memory gate and the diffusion layer electrode is increased. Consequently, a great quantity of holes occur and a large erase current flows. It is therefore effective to weaken erasure by reducing "Vs" in Step 1, as shown in FIG. 24. Also, the erase current can be controlled by setting pulse width as shown in FIG. 25.

In addition, it is known that when positive-hole injection is conducted by applying an erasing pulse, the occurrence of holes is suppressed by the charge of stored holes. For sufficient erasure, therefore, it is effective to strengthen the electric field stepwise. Hole injection is known to stress the insulating film and deteriorate the film, so that excessive hole injection needs to be avoided. Injection of unnecessary holes is avoidable by, as shown in the reference table of FIG. 26, stepping up the electric field while conducting the verification, and when sufficient erasure is completed, stopping further erasing steps. Also, efficient erasure is possible by setting memory gate biases as shown in FIG. 27.

Figures 27, 28:
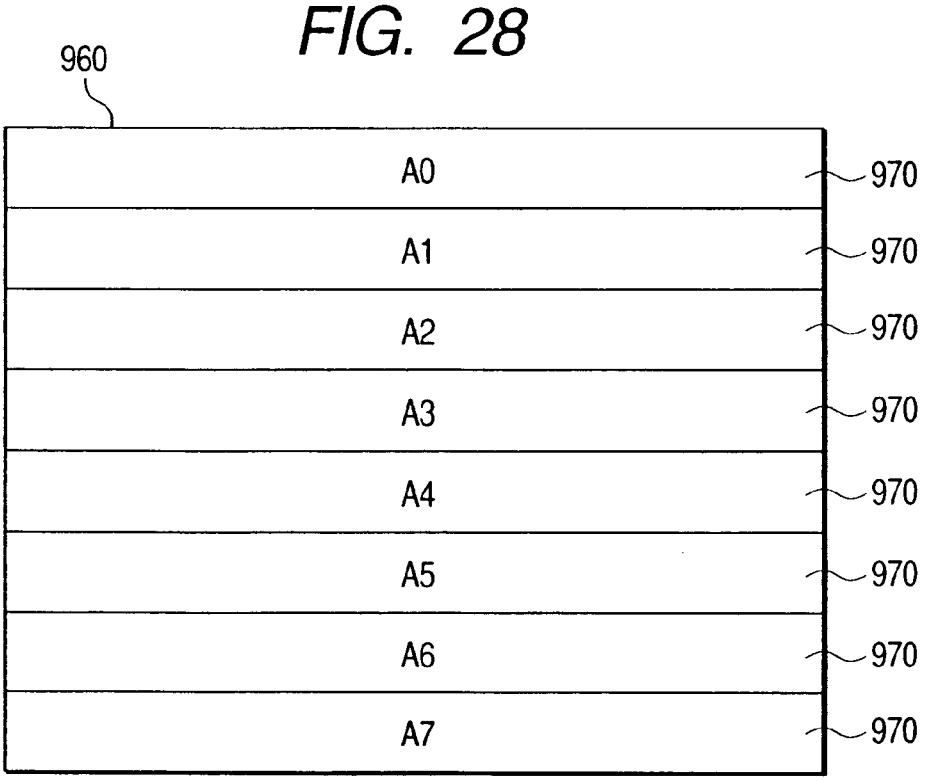
FIG. 27 is still another erasing-pulse setting reference table.
FIG. 28 is a memory array construction diagram.

The erasing operation can be conducted by splitting a memory array 960 into blocks 970 for reduced erase current, as shown in FIG. 28. FIG. 28 shows an example of splitting the array into eight blocks from A0 to A7. A reference table associated with this example is shown in FIG. 29, wherein an item of "Selected block" is added. A block is selected in each of Steps 1 to 24, and all blocks are selected in Step 25. During this sequence, the electrons that have been stored at an initial stage of erasure generate a strong electric field, thus creating a flow of a large erase current. Current can be reduced by conducting the initial erasure in each block. The erasure in each block will also produce non-selected cells during the erasure, and the need arises, therefore, to pay consideration to disturbances. The erasure sequence for selecting all blocks in Step 25, for example, is effective in that sense. Since erasure has been conducted once, even when all blocks are selected, the current can be controlled to a small value. In this erasure sequence, pulses can be applied in a multi-step format while selecting all blocks in order, as shown in FIG. 30.

FIG. 31 shows a reference table for conducting erasure while supplying a current to the select transistor. Erasure efficiency can be improved by adding hot-carrier components due to the channel current. Use of this erasure scheme poses the problem in that excess hot carriers occur and lead to dielectric breakdown of the element. It is therefore effective to use the current control shown in FIG. 20. A reference table in that case is shown in FIG. 32. For example, one method is by setting "Vd" so that channel current Ip may flow with a value of 1 µA.

This positive-hole injection scheme has the feature in which even if the diffusion layer voltage (Vs) is reduced, a positive hole can be injected. Conducting such multi-step erasure as based on the reference table shown in FIG. 33 is effective for leakage current reduction. More specifically, in Step 1, stored electrons generate a strong electric field between the diffusion layer and the memory gate, thus producing a large leakage current. In Step 1, therefore, it is effective to lower the diffusion layer voltage for reduced leakage current. This is possible by proceeding with the erasure after alleviation of the electrons stored in Step 1.

Comparing the erasing operation in Step 1 with the programming operation allows one to see that the settings of memory gate potentials are only reversed in terms of polarity. In Step 1, therefore, if reprogramming is repeated by setting the programming operation that yields a strong CHE-like effect, it is possible to reduce the positive holes stored at the end of the diffusion layer. A reference table relating to a multi-step sequence applicable in such a case is shown in FIG. 34. The process performed simultaneously with the programming or erasing operation is executable in addition to the reference table. The reference table shown in FIG. 35 relates to the sequence of removing excess positive holes by applying a positive potential to the memory gate after multi-step erasure. It is possible to take the sequence of, as shown in the reference table of FIG. 36, positively biasing the memory gate in all blocks after erasure in each block.

Third Embodiment

Next, integrating a plurality of memory modules will be described below.

Figure 12:
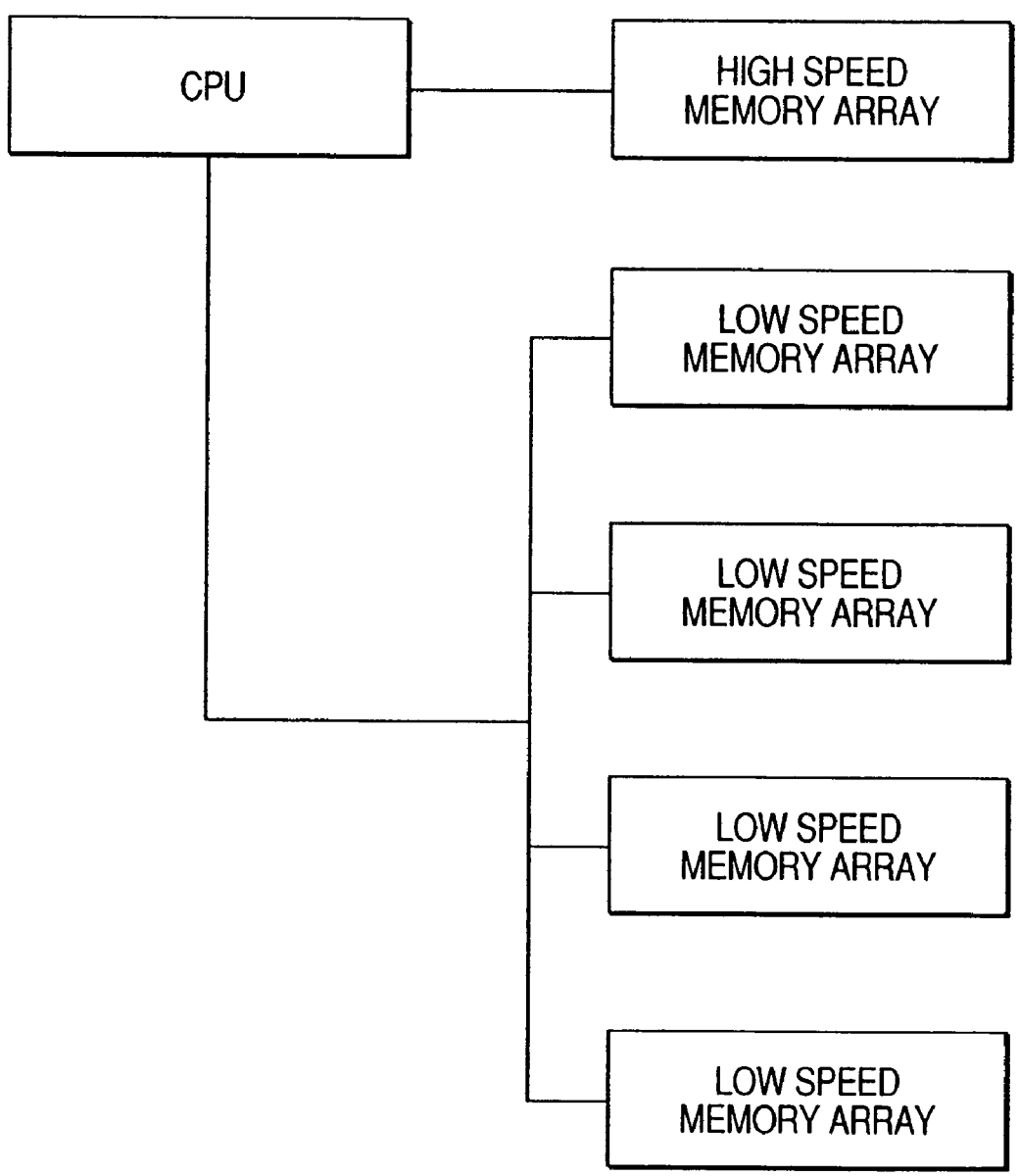
FIG. 12 is a chip construction diagram.

A configuration diagram is shown in FIG. 12. The need arises to mixedly mount, on a chip, a memory array that requires operation at high speed, and arrays that require operation at low speed for purposes such as reduction in power consumption. During such mounting, it is possible, as mentioned above, to use the hot-hole injection scheme for the array that is to be operated at high speed. In this case, even for the same memory cell, an operation mode can be changed as necessary. In the configuration of FIG. 12, the verification described in the first and second embodiments can be applied only to the high-speed memory array.

The meanings of the numerals and symbols used in the drawings accompanying the present application are shown below.

100 . . . Substrate,
200, 300, 210, 310 . . . Diffusion layer,
500, 1500 . . . Select transistor,
550, 1550 . . . Memory transistor,
800, 810, 820 . . . Carrier-generating region,
850, 851 . . . Electron injection region,
900 . . . Select gate-insulating film,
940 . . . Sidewall,
950 . . . Memory gate-insulating film,
954, 956 . . . Silicon oxide film,
955 . . . Silicon nitride film,
960 . . . Memory array,
970 . . . Memory array block,
$V_A, V_B, V_C, V_D, V_E, V_F$ . . . Threshold level.

What is claimed is:

1. An integrated semiconductor nonvolatile memory, comprising:
    a first field effect transistor with a first gate having a gate electrode formed on a semiconductor substrate via an insulating film; and
    a second field effect transistor with a second gate electrode formed on the semiconductor substrate via a charge storage film, adjacent to the first field effect transistor;

wherein programming or erasure is executed by applying a voltage to the second gate electrode and injecting holes from a side of the semiconductor substrate to the charge storage film;

wherein the programming or erasure is executed by repeating pulse application to the second gate electrode;

wherein there are a first period and a second period after the first period while the programming or erasure is executed; and wherein verification voltage is applied to the second gate electrode in the second period and verification voltage is not applied to the second gate electrode in the first period.

2. The integrated semiconductor nonvolatile memory according to claim 1, wherein a pulse height in the second period is greater than that in the first period.

3. The integrated semiconductor nonvolatile memory according to claim 1, wherein the erasure is executed by injecting holes and the programming is executed by injecting electrons.

4. The integrated semiconductor nonvolatile memory according to claim 3, wherein a position to which electrons are injected in the charge storage film by a second pulse is farther from the first gate than a position to which electrons are injected in the charge storage film by a first pulse.

5. The integrated semiconductor nonvolatile memory according to claim 1, wherein a first programming or erasure is earlier than a second programming or erasure; and wherein the first period of the first programming or erasure is longer than the first period of the second programming or erasure.

6. The integrated semiconductor nonvolatile memory according to claim 1, wherein the charge storage film includes a silicon nitride film.

7. An integrated semiconductor nonvolatile memory, comprising:

a field effect transistor with a gate electrode formed on a semiconductor substrate via a charge storage film;

wherein programming or erasure is executed by applying a voltage to the gate electrode and injecting holes from a side of the semiconductor substrate to the charge storage film;

wherein the programming or erasure is executed by repeating pulse application to the gate electrode;

wherein there are a first period and a second period after the first period while the programming or erasure is executed; and wherein verification voltage is applied to the gate electrode in the second period and verification voltage is not applied to the gate electrode in the first period.

8. The integrated semiconductor nonvolatile memory according to claim 7, wherein a pulse height in the second period is greater than that in the first period.

9. The integrated semiconductor nonvolatile memory according to claim 7, wherein the erasure is executed by injecting holes and the programming is executed by injecting electrons.

10. The integrated semiconductor nonvolatile memory according to claim 9, wherein a position to which electrons are injected in the charge storage film by a second pulse is different from position to which electrons are injected in the charge storage film by a first pulse.

11. The integrated semiconductor nonvolatile memory according to claim 7, wherein a first programming or erasure is earlier than a second programming or erasure; and wherein the first period of the first programming or erasure is longer than the first period of the second programming or erasure.

12. The integrated semiconductor nonvolatile memory according to claim 7, wherein the charge storage film includes a silicon nitride film.

* * * * *

UNITED STATES PATENT AND TRADEMARK OFFICE
CERTIFICATE OF CORRECTION

PATENT NO. : 7,443,731 B2  
APPLICATION NO. : 11/727592  
DATED : October 28, 2008  
INVENTOR(S) : Digh Hisamoto et al.

Page 1 of 1

It is certified that error appears in the above-identified patent and that said Letters Patent is hereby corrected as shown below:

On the title page, insert item (30), as follows:

--(30) Foreign Application Priority Data  
Mar. 7, 2005 (JP) ..................... 2005-062063  
May 27, 2004 (JP) ..................... 2004-157209--

Signed and Sealed this

Tenth Day of November, 2009

David J. Kappos  
*Director of the United States Patent and Trademark Office*